US007432516B2

(12) United States Patent
Peggs et al.

(10) Patent No.: US 7,432,516 B2
(45) Date of Patent: Oct. 7, 2008

(54) RAPID CYCLING MEDICAL SYNCHROTRON AND BEAM DELIVERY SYSTEM

(75) Inventors: Stephen G. Peggs, Port Jefferson, NY (US); J. Michael Brennan, East Northport, NY (US); Joseph E. Tuozzolo, Sayville, NY (US); Alexander Zaltsman, Commack, NY (US)

(73) Assignee: Brookhaven Science Associates, LLC, Upton, NY (US)

(*) Notice: Subject to any disclaimer, the term of this patent is extended or adjusted under 35 U.S.C. 154(b) by 387 days.

(21) Appl. No.: 11/337,916

(22) Filed: Jan. 24, 2006

(65) Prior Publication Data

US 2007/0170994 A1 Jul. 26, 2007

(51) Int. Cl.
*H03L 7/00* (2006.01)

(52) U.S. Cl. ................. 250/492.3; 250/492.1; 250/281; 250/290; 250/291; 331/34; 315/500; 315/501; 315/503; 315/507

(58) Field of Classification Search ............. 250/492.1, 250/492.3, 281, 290, 291; 331/34; 315/503, 315/500, 501, 507
See application file for complete search history.

(56) References Cited

U.S. PATENT DOCUMENTS

| | | | | |
|---|---|---|---|---|
| 3,543,171 | A * | 11/1970 | Smith | 315/503 |
| 4,769,623 | A * | 9/1988 | Marsing et al. | 335/216 |
| 4,780,683 | A * | 10/1988 | Nakata | 315/503 |
| 4,870,287 | A * | 9/1989 | Cole et al. | 250/492.3 |
| 4,961,056 | A * | 10/1990 | Yu | 315/503 |
| 4,992,746 | A | 2/1991 | Martin | |
| 5,001,438 | A | 3/1991 | Miyata et al. | |
| 5,027,098 | A * | 6/1991 | Okazaki et al. | 335/213 |
| 5,073,913 | A | 12/1991 | Martin | |
| 5,260,581 | A * | 11/1993 | Lesyna et al. | 250/492.3 |
| 5,285,166 | A * | 2/1994 | Hiramoto et al. | 315/507 |
| 5,329,241 | A * | 7/1994 | Reusch | 315/503 |
| 5,349,198 | A | 9/1994 | Takanaka | |
| 5,382,914 | A | 1/1995 | Hamm et al. | |
| 5,511,549 | A | 4/1996 | Legg et al. | |

(Continued)

FOREIGN PATENT DOCUMENTS

JP 09167699 A * 6/1997

OTHER PUBLICATIONS

Cardona et al., “Optical Design of the Rapid Cycling Medical Synchrotron,” IEEE Transactions on Nuclear Science, vol. 50, No. 4, Aug. 2003.

(Continued)

*Primary Examiner*—Jack I. Berman
*Assistant Examiner*—Michael J Logie
(74) *Attorney, Agent, or Firm*—Lori-Anne Neiger

(57) ABSTRACT

A medical synchrotron which cycles rapidly in order to accelerate particles for delivery in a beam therapy system. The synchrotron generally includes a radiofrequency (RF) cavity for accelerating the particles as a beam and a plurality of combined function magnets arranged in a ring. Each of the combined function magnets performs two functions. The first function of the combined function magnet is to bend the particle beam along an orbital path around the ring. The second function of the combined function magnet is to focus or defocus the particle beam as it travels around the path. The radiofrequency (RF) cavity is a ferrite loaded cavity adapted for high speed frequency swings for rapid cycling acceleration of the particles.

24 Claims, 17 Drawing Sheets

U.S. PATENT DOCUMENTS

| | | | | |
|---|---|---|---|---|
| 5,523,659 | A | 6/1996 | Swenson | |
| 5,557,178 | A * | 9/1996 | Talman | 315/501 |
| 5,585,642 | A | 12/1996 | Britton et al. | |
| 5,661,366 | A * | 8/1997 | Hirota et al. | 315/5.41 |
| 5,895,926 | A | 4/1999 | Britton et al. | |
| 5,917,293 | A * | 6/1999 | Saito et al. | 315/505 |
| 6,035,015 | A * | 3/2000 | Ruth et al. | 378/119 |
| 6,246,172 | B1 * | 6/2001 | Bizen et al. | 315/5.41 |
| 6,403,967 | B1 * | 6/2002 | Chen et al. | 250/396 ML |
| 6,683,318 | B1 * | 1/2004 | Haberer et al. | 250/492.3 |
| 7,060,997 | B2 * | 6/2006 | Norimine et al. | 250/505.1 |
| 2003/0141448 | A1 * | 7/2003 | Symons | 250/290 |
| 2005/0231138 | A1 * | 10/2005 | Nakanishi et al. | 315/500 |
| 2005/0247890 | A1 * | 11/2005 | Norimine et al. | 250/492.3 |

OTHER PUBLICATIONS

Peggs et al., "RCMS—A Second Generation Medical Synchrotron," Publication, 2001.

Beebe-Wang et al., "Beam Dynamics Simulations in the Rapid Cycling Medical Synchrotron," Proceedings of EPAC, pp. 2718-2720, 2002.

Cardona, "Linear and Non Linear Studies at RHIC Interaction Regions and Optical Design of the Rapid Cycling Medical Synchrotron," Aug. 2003.

* cited by examiner

RAPID CYCLING MEDICAL SYNCHROTRON AND BEAM DELIVERY SYSTEM

This invention was made with Government support under contract number DE-AC02-98CH10886, awarded by the U.S. Department of Energy. The Government has certain rights in the invention

BACKGROUND OF THE INVENTION

The present invention relates generally to a medical proton therapy facility and, more particularly, to a medical synchrotron having strong focusing, rapid cycling and fast extraction capabilities.

It has been known in the art to use a synchrotron and gantry arrangement to deliver proton beams from a single proton source to one of a plurality of patient treatment stations for proton therapy. For example, U.S. Pat. No. 4,870,287 to Cole et al. discloses a multi-station proton beam therapy system for selectively generating and transporting proton beams from a single proton source and accelerator to one of a plurality of patient treatment stations each having a rotatable gantry for delivering the proton beams at different angles to the patients. A duoplasmatron ion source generates the protons which are then injected into an accelerator at 1.7 MeV. The accelerator is a synchrotron containing ring dipoles, zero-gradient dipoles with edge focusing, vertical trim dipoles, horizontal trim dipoles, trim quadrupoles and extraction Lambertson magnets.

The beam delivery portion of the Cole et al. system includes a switchyard and gantry arrangement. The switchyard utilizes switching magnets that selectively direct the proton beam to the desired patient treatment station. Each patient treatment station includes a gantry having an arrangement of bending dipole magnets and focusing quadrupole magnets. The gantry is fully rotatable about a given axis so that the proton beam may be delivered at any desired angle to the patient.

U.S. Pat. No. 4,992,746 to Martin discloses an ion therapy system including a pre-accelerator and a rapid cycling synchrotron. The system may be used for proton therapy whereby a proton beam is extracted from the synchrotron and injected into a storage ring by fast extraction using a kicker magnet and a septum magnet. The pre-accelerator includes a LINAC that produces protons at energies of the order of 50 MeV.

U.S. Pat. No. 5,382,914 to Hamm et al. discloses a proton-beam therapy LINAC including a secondary stepped frequency drift tube LINAC (DTL) in addition to a radio-frequency-quadrupole (RFQ) LINAC for acceleration of low-peak-current proton beams. The DTL accelerates the proton beam from 12.5 MeV to 70.4 MeV over a length of 7.92 meters. U.S. Pat. No. 5,001,438 to Takanaka discloses a beam supply device for use in a patient therapy system. The device includes a rotatable switching magnet for directing a particle or radiation beam to one of several patient treatment stations arranged around the rotatable switching magnet. A rotatable switching magnet is provided, which eliminates the need for a switchyard with multiple switching magnets.

It would be desirable to improve upon the prior art medical proton therapy facilities by providing many pulses of beam per second, faster beam extraction, stronger beam focusing and more rapid cycling, while at the same time permitting irradiation by multiple particle species.

SUMMARY OF THE INVENTION

The present invention is a medical synchrotron for accelerating particles in a particle beam therapy system and delivering many pulses of beam every second. The synchrotron generally includes a radiofrequency (RF) cavity for accelerating the particles as a beam and a plurality of combined function magnets arranged in a ring. Each of the combined function magnets performs two functions. The first function of the combined function magnet is to bend the particle beam along an orbital path around the ring. The second function of the combined function magnet is to focus or defocus the particle beam as it travels around the path.

The plurality of combined function magnets preferably includes a horizontally focusing magnet arranged in an alternating sequence with a horizontally defocusing magnet. The focusing magnet performs the combined function of bending the particle beam and focusing the particle beam and the defocusing magnet performs the combined function of bending the particle beam and defocusing the particle beam.

In either case, the combined function magnet preferably includes an evacuated arcuate beam pipe defined by a center of curvature, two saddle coils arranged on opposite sides of the beam pipe and a ferro-magnetic core surrounding the beam pipe and the saddle coils. The core has a structural configuration for providing a magnetic field in the beam pipe which varies in strength in a direction toward the magnet's center of curvature. In the case of a focusing combined function magnet, the core has a structural configuration adapted for providing a magnetic field in the beam pipe which becomes weaker in the direction toward the magnet's center of curvature. In the case of a defocusing combined function magnet, the core has a structural configuration adapted for providing a magnetic field in the beam pipe which becomes stronger in the direction toward the magnet's center of curvature.

Preferably, the ferro-magnetic core is made from a plurality of upper laminates and a plurality of lower laminates stacked on opposite sides of the beam pipe. The upper and lower laminates have a middle arm terminating at an angled end adjacent the beam pipe. The orientation of the angled ends of the upper and lower laminates provides the varying strength magnetic field in the beam pipe. In the case of a focusing combined function magnet, the angled ends of the upper and lower laminates form an angle whose intersection point falls outside the arc of the beam pipe with respect to the magnet's center of curvature. In the case of a defocusing combined function magnet, the angled ends of the upper and lower laminates form an angle whose intersection point falls inside the arc of the beam pipe with respect to the center of curvature of the magnet.

In a preferred embodiment, the radiofrequency (RF) cavity is a ferrite loaded cavity adapted for high speed frequency swings for rapid cycling acceleration of the particles. The ferrite loaded RF cavity includes a housing, a beam pipe having two longitudinal gaps centrally disposed in the housing, and a plurality of ferrite rings associated with each gap surrounding the beam pipe.

In this regard, the present invention further involves a method for accelerating particles in a medical synchrotron of a particle beam therapy system. The method generally includes the steps of steering particles of a particle beam along an orbital path with a plurality of magnets arranged in a ring defining the orbital path and applying a tuning current to a ferrite loaded radiofrequency (RF) cavity disposed in the orbital path to achieve a high speed frequency swing for rapid cycling acceleration of the particles in the particle beam.

Preferably, the tuning current is applied to the ferrite loaded RF cavity to achieve a frequency swing from about 1.2 MHz to about 6.0 MHZ in about 15-17 ms and is applied at a repetition rate of about 30 Hz.

The method further preferably includes the steps of focusing and defocusing the particle beam along the orbital path with the plurality of magnets. The steps of steering the particle beam, focusing the particle beam and defocusing the particle beam are preferably performed with a series of focusing combined function magnets arranged in sequence in the ring. The focusing combined function magnet performs a first function of bending the particle beam and a second function of focusing the particle beam. The defocusing combined function magnet performs a first function of bending the particle beam and a second function of defocusing the particle beam.

The medical synchrotron of the present invention may be utilized in a particle beam therapy system having a source of particles an injector for transporting particles from the source to the synchrotron, one or more patient treatment stations including rotatable gantries for delivering a particle beam to a patient and a beam transport system for transporting the accelerated beam from the synchrotron to the patient treatment station.

The preferred embodiments of the rapid cycling medical synchrotron of the present invention, as well as other objects, features and advantages of this invention, will be apparent from the following detailed description, which is to be read in conjunction with the accompanying drawings. The scope of the invention will be pointed out in the claims.

DETAILED DESCRIPTION OF THE PREFERRED EMBODIMENTS

A preferred form of the rapid cycling medical synchrotron (RCMS) has the primary parameters listed in Table 1.

TABLE 1

| | |
|---|---|
| Maximum extraction energy [MeV] | 250 |
| Minimum extraction energy [MeV] | 60 |
| Injection kinetic energy [MeV] | 7 |
| Repetition rate $f_{rep}$ [Hz] | 30 |
| Treatment protons per bunch N, min | $1.0 \times 10^7$ |
| Treatment protons per bunch N, max | $1.7 \times 10^9$ |
| Proton flux R, max [1/min] | $3.0 \times 10^{12}$ |
| Circumference C [m] | 30.65 |
| Normalized RMS emittance, $\epsilon$ [μm] | 0.15 |

One of the distinguishing features of the RCMS of the present invention is the rapid cycling oscillation of its main magnets, at a frequency of 30 Hz. The electrical circuit of the RCMS main magnets is very similar to the circuitry of a transformer, leading to very stable, simple, and reliable performance. Since the RCMS cycle is about 100 times faster than other "slow cycling" synchrotrons, the number of protons accelerated per cycle can be as much as 100 times smaller, for a fixed treatment time. This leads to three main advantages: faster treatment times; less beam per cycle; and easy, flexible beam extraction.

Another distinguishing feature of the RCMS is the strong focusing arrangement of its magnetic optics. Combined with the avoidance of space charge effects, with fast extraction, and with the intrinsically small size of the injected beam, this leads to very small beam sizes (of approximately 1 mm). Small beams enable smaller, lighter, and less power-hungry magnets, not only in the synchrotron, but also in the beam transport lines, and in the gantries.

Figure 1:
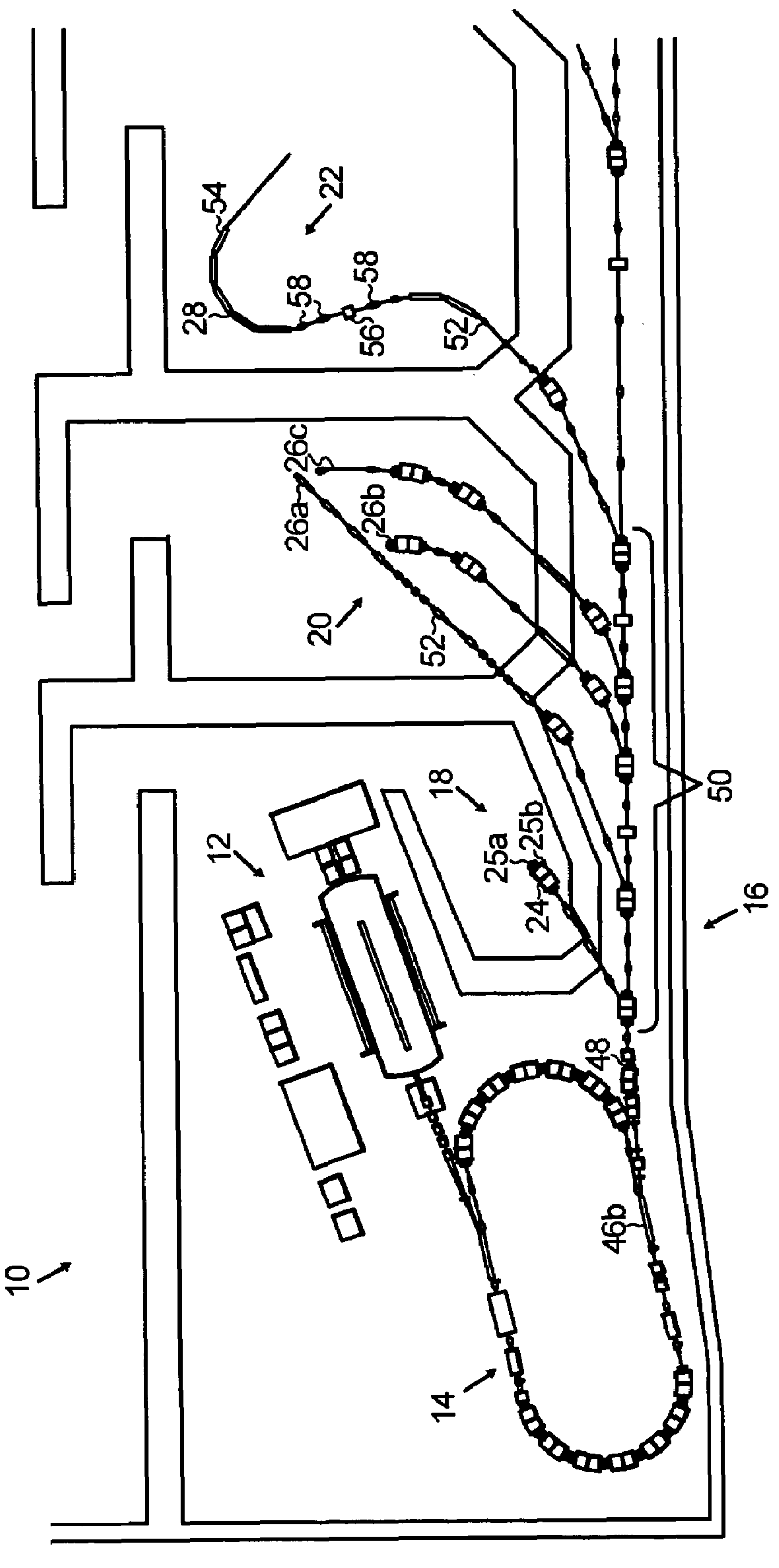
FIG. 1 is a top plan view of the rapid cycling medical synchrotron (RCMS) of the present invention.

Turning to FIG. 1, the RCMS 10 of the present invention generally includes an injector 12, a synchrotron accelerator 14, and a beam delivery network 16 for diverting independent beam lines to various applications as desired. For example, the beam delivery network 16 may be designed to deliver a beam to a beam research room 18, a fixed beam treatment room 20 and a rotatable gantry treatment room 22.

The research room 18 is provided for research and calibration purposes, with an entrance separate from the patient areas. This research room 18 includes a switching magnet 24 capable of bending an incoming proton beam by 30 degrees, between two independent beam lines 25*a* and 25*b*. Thus, the research room 18 preferably has two independent horizontal beam lines, without nozzles, digital imagers, or multi-leaf collimators.

The fixed beam treatment room 20 preferably includes three beam lines 26*a*, 26*b* and 26*c*. A small field beam line is directed to a chair for eye treatments and two orthogonal large field beam lines are provided for horizontal and vertical beam direction. The eye beam line preferably generates a beam up to 5 cm in diameter that is uniform to +/−3% in the central 80% of the beam profile, so that treatment to a depth of 5 cm can be achieved. Preferably, a dual dosimeter system monitors the dose and terminates the beam if the uniformity is outside flatness and symmetry requirements. Also, a machined aperture can be positioned on the eye beam line within 5 cm of the patient.

Each rotatable gantry treatment room 22 preferably includes a rotating gantry 28, which is rotatable by plus or minus 200 degrees from the vertical. The gantry 28 can be a passive scattering gantry, or a 3-D conformal irradiation scanning gantry, (e.g., supporting double scattering nozzles or scanning nozzles). The treatment rooms, and in particular the gantry rooms, are laid out in a linear fashion, so that routine operation is possible even with a partial complement of finished rooms. In this manner, it will be possible to run a beam into the initial fixed beam 20 and gantry rooms 22 while the rest of the facility is being constructed. Preferably, the overall RCMS facility is designed so that each component treatment room operates independently of the others (i.e., it is possible to remove one beam line from service without affecting the rest of the facility).

Figure 2:
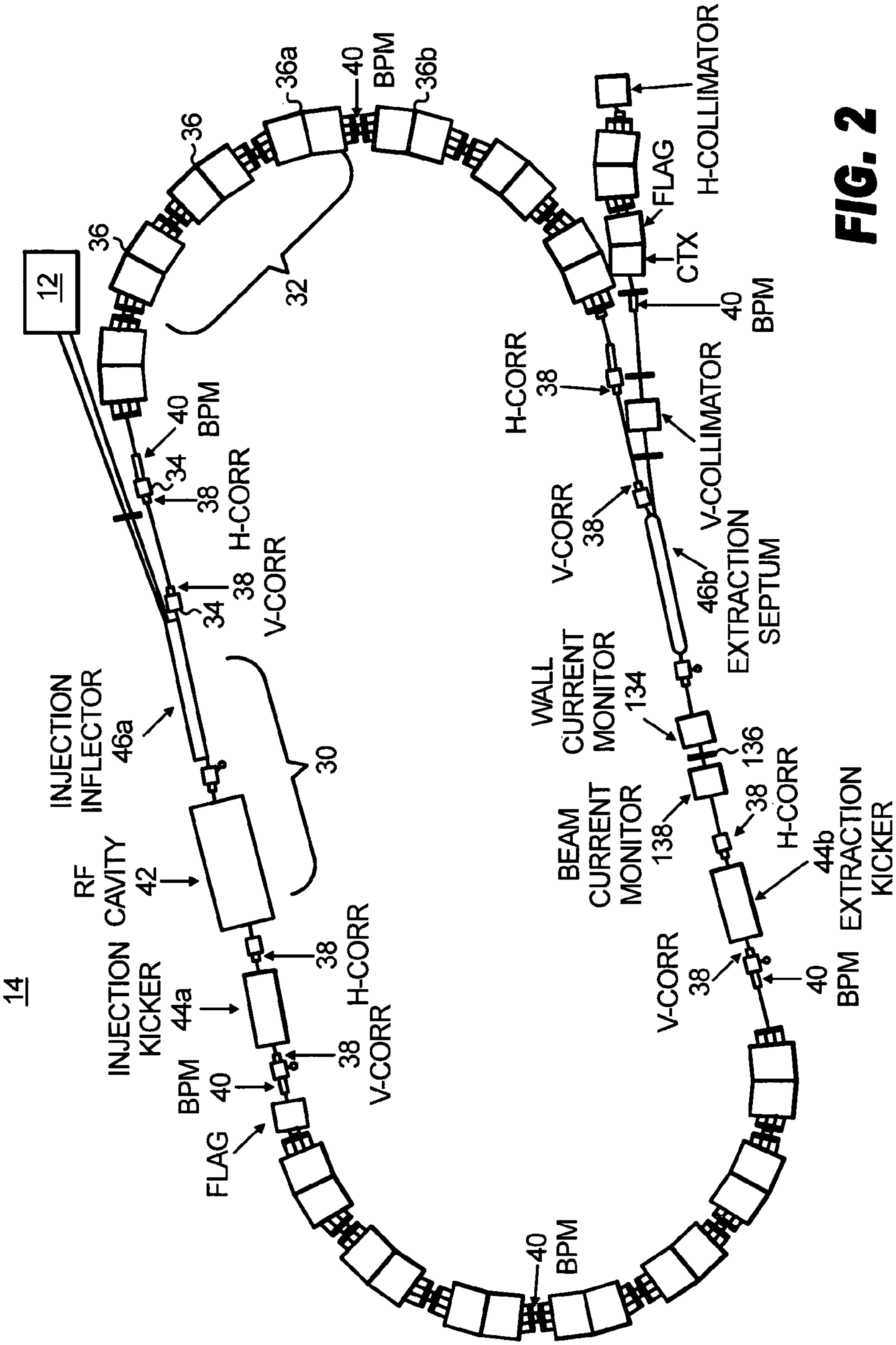
FIG. 2 is a top plan view of the synchrotron of the present invention shown in FIG. 1.

FIG. 2 shows the synchrotron 14 of the present invention in further detail. The synchrotron 14 generally consists of two straight sections 30 and two 180 degree arc sections 32. Each straight section 30 preferably includes five half-cells 34, without bending magnets, and each arc section 32 preferably includes seven half-cells 36 with combined function magnets (FODO magnets). The straight sections 30 accommodate the functions of injection, extraction, and acceleration. The primary physical and optical parameters for the synchrotron are listed in Table 2.

TABLE 2

| | |
|---|---|
| Circumference, C [m] | 30.65 |
| Number of FODO cells in the arcs | 7 |
| Half-cell length in the arc [m] | 1.1 |
| Maximum distance between quadrupoles [m] | 1.8 |
| Bend magnetic length [m] | 0.760 |
| Quadrupole magnetic length [m] | 0.14 |
| Injection pulse length, $\Delta t$ [ns] | 25-100 |
| Injection pulse current [mA] | 0.06-2.72 |
| Normalized rms emittance, $\epsilon$ [μm] | 0.15 |
| Momentum width at injection (rms), $\sigma_p/p$ | 0.001 |
| Total momentum width at injection, $\Delta p/p$ | +/−0.0023 |
| Total kinetic energy width at injection, $\Delta K$ [keV] | +/−32 |
| Horizontal tune, $Q_x$ | 3.38 |
| Vertical tune, $Q_y$ | 3.36 |
| Average phase advance per cell, Horizontal (Arcs) [deg] | 108 |
| Average phase advance per cell, Vertical (Arcs) [deg] | 92.16 |
| Max. horizontal beta function, $\beta_{xmax}$ [m] | 5.79 |
| Max. vertical beta function, $\beta_{ymax}$ [m] | 6.23 |
| Max. dispersion function, $\eta_{max}$ [m] | 2.01 |

TABLE 2-continued

| | |
|---|---|
| Natural horizontal chromaticity, $\xi_x$ | −1.48 |
| Natural vertical chromaticity, $\xi_y$ | −4.14 |
| Transition gamma, T | 2.72 |

The half-cell magnets 34 used in the straight sections are short quadrupole magnets for focusing the proton beam. The combined function main magnets 36 are the sole optical component of the arcs. As will be discussed in further detail below, the combined function magnets both bend the proton beam and focus/defocus the beam. In particular, the combined function magnets 36 are bent in a chevron shape, with respect to a magnet center of curvature, for bending the proton beam. These magnets are further designed in either a focusing (F) or defocusing (D) style that differ only slightly in the 2-D cross section of the magnet laminations. The optical lattice also preferably includes a modest number of dipole correctors 38 and Beam Position Monitors (BPMs) 40. Each BPM is integrated into a vacuum pipe near the RCMS quadrupoles 34. Only one type of each of these magnets (and diagnostics) is used, simplifying the design and reducing the required number of spares. As will be discussed in further detail below, one half-cell in one of the straight sections 30 is occupied by a radio frequency cavity 42. Moreover, each straight section 30 further includes a fast kicker 44*a* and 44*b* and a septum magnet 46*a* and 46*b* separated by one half-cell.

Variation of the extraction energy is achieved by adjusting a trigger based on the RF frequency to control the extraction time. This avoids the necessity for energy degraders, delivering high quality beam with good energy resolution and few losses. Although the excitation of the transport line magnets needs to change in proportion to the extraction momentum, the transport lines are designed to be insensitive to momentum matching errors and magnet settling effects, since they are achromatic and (mostly) dispersionless.

The dispersion at the entrance and exit points of the arcs 32 is zero, so the straight sections 30 are dispersion free. The dispersion matching in the arcs 32 is performed by choosing suitable values for the quadrupole components of the two different kinds of combined function magnet 36. The quadrupole components of the combined function magnet 36 have also been chosen to make the beam size as small as possible. Since the half cells 34 in the straight sections 30 are longer than those in the arcs 32, it is necessary to match the beta functions between the arcs and the straight sections.

Table 3 lists the expected beam sizes and other parameters at 3 times corresponding to injection, minimum extraction energy, and maximum extraction energy, using the beam parameters from Table 2.

TABLE 3

| | Injection | minimum | maximum |
|---|---|---|---|
| Kinetic energy, K [MeV] | 7.0 | 60.0 | 250.0 |
| Momentum, p [MeV/c] | 114.8 | 340.87 | 729.1 |
| Lorentz | 1.0075 | 1.0639 | 1.2664 |
| Lorentz | 0.122 | 0.3415 | 0.614 |
| Revolution frequency, $F_{rev}$ [MHz] | 1.188 | 3.340 | 6.002 |
| Revolution period, $T_{rev}$ [μs] | 0.842 | 0.300 | 0.166 |
| Rigidity, $B\rho$ [Tm] | 0.383 | 1.137 | 2.432 |
| Dipole field, B [T] | 0.226 | 0.671 | 1.436 |
| Normalized rms emittance [μm] | 0.15 | 0.15 | 0.15 |
| Unnormalized RMS emittance $\epsilon_u$ [μm] | 1.22 | 0.413 | 0.193 |

TABLE 3-continued

| | Injection | minimum | maximum |
|---|---|---|---|
| Max vertical rms beam size [mm] | 2.76 | 1.60 | 1.10 |
| Max horizontal rms beam size [mm] | 2.66 | 1.55 | 1.06 |
| Max dispersive (horz) size, HWFM [mm] | 6.50 | 2.67 | 0.97 |

A single resonant power supply drives all of the synchrotron bending magnets in series, combining a sinusoidal alternating current of amplitude $I_{AC}$ with a constant direct current $I_{DC}$, so that the total bending magnet current is:

$$I(t)=I_{DC}-I_{AC}\cos(2\pi f_{rep}t)$$

Injection occurs at t=0 when the current $I=I_{DC}-I_{AC}$ is at its minimum. Extraction may occur at any time between t=7 ms and t=16.7 ms, when the kinetic energy K is in the range 60 to 250 MeV. The magnetic field B in the bending magnets, and the beam momentum P are both proportional to the main magnet current (except for small saturation effects).

The energy for proton beam acceleration is supplied by a single Radio Frequency (RF) cavity 42, with a voltage that varies sinusoidally during the acceleration half of the magnetic cycle. The RF system and beam performance in longitudinal phase space are discussed at greater length below The beam injector module 12 is a conventional tandem Van de Graaf injector. While the incoming beam from the injector 12 into the synchrotron 14 is always in the same horizontal plane as the circulating beam, the horizontal angle and displacement between the two must be reduced to zero. This is the function of the electrostatic injection inflector 46*a* and the injection kicker 44*a*, shown in FIG. 2. The electrostatic injection inflector 46*a* generates a constant electrostatic field and, at the end of the inflector both beams are in the same beam pipe for the first time. The injection kicker 44*a*, which is a pulsed magnet, completes the task of injection. The key parameters of the electrostatic inflector 46*a* and the injection kicker 44*a* are summarized in Table 4.

TABLE 4

| | |
|---|---|
| Electrostatic Inflector | |
| Bend angle, $\phi$ | 6.5° |
| Radius of curvature, $\rho$ [m] | 11.5 |
| Active length, D + d [m] | 1.4 |
| Septum thickness [mm] | 1 |
| Gap, gI [mm] | 18 |
| Voltage, V [kV] | 22 |
| Electric field [kV/cm] | 12 |
| Injection Kicker | |
| Kick angle, $\phi_K$ [mrad] | 5.3 |
| Magnetic length [m] | 0.2 |
| Magnetic field, B [G] | 100 |
| Gap, gK [mm] | 30 |
| Current, NI [A] | 240 |
| Rise time [ms] | <16 |
| Flat top [ns] | >100 |
| Fall time [ns] | <600 |
| (Revolution Period [ns] | 840) |

Turning to the extraction side of the synchrotron, 14, the fast kicker magnet on this side is termed an extraction kicker 44*b* and the septum magnet is termed an extraction septum 46*b*. The injection and extraction interfaces of the synchrotron 14 are similar in many ways. The extraction kicker 44*b* begins the extraction process by quickly turning on a vertical magnetic field during a selected turn number, thereby selecting the energy of the extracted beam. The angle is sufficient to move the beam horizontally across a current sheet at the upstream end of the extraction septum magnet 46*b*, which also bends the beam horizontally. The positions of the extraction kicker 44*b* and the extraction septum 46*b* are shown schematically in FIG. 2.

Key parameters of the extraction kicker 44*b* and the septum magnet 46*b* are summarized in Table 5.

TABLE 5

| | |
|---|---|
| Extraction Kicker | |
| Bend Angle [mrad] | 5.48 |
| Magnetic strength [Gm] | 133 |
| Magnetic length [m] | 0.8 |
| Magnetic field [G] | 167 |
| Gap [mm] | 30 |
| Current [A] | 398 |
| Rise time [ns] | <100 |
| Flat top [ns] | >70 |
| Fall time [ms] | <16 |
| (Revolution Period [ns] | 167) |
| Septum Magnet | |
| Bend angle | 6.5° |
| Radius of curvature [m] | 12.268 |
| Length [m] | 1.481 |
| Magnetic field [G] | 1983 |
| Gap [mm] | 12 |
| Septum (Cu) thickness [mm] | 4 |
| Current [A] | 1893 |
| Half-sine pulse length [μs] | 10 |
| Ripple | <2% |

The beam delivery network 16 connects the synchrotron 14 to the research room 18, and the treatment rooms 20 and 22. The network 16 generally includes an extraction line 48, a switchyard 50, a plurality of beam transport lines 52, and the gantry optical interfaces 54. The extraction line 48 comes just after the extraction septum magnet 46*b* and before the switchyard 50, as shown in FIG. 1. The switchyard 50 is a periodic structure of FODO cells, providing identical lattice functions at the entrance to each beam line. This enables all the gantries 28 to have the same optical design. The transport lines 52 take the beam from the switchyard 50 to the different rooms of the facility. The research room 18 has two transport lines 25*a* and 25*b* with bending angles that differ by 30 degrees. The fixed beam room 20 has one 45 degree transport line that goes to the vertical fixed beam line, and two horizontal 90 degree transport lines. The transport lines 52 that connect the switchyard 50 to the gantry optical interfaces 54 are identical, and the same as the 45 degree transport lines used in the fixed beam room.

Since the beam energy in the delivery beam lines 52 changes only relatively slowly, delivery line dipoles and quadrupoles can have solid cores, instead of laminated cores. The same type of quadrupole is used in both the transport lines 52 and in the gantry optics 54. The beam delivery dipoles are chevron magnets with a length of 0.68 m and a deflection angle of 22.5 degrees. These dipoles are big enough to allow the beam to exit in a straight line when the magnet is turned off, as required in some operational modes in the switchyard 50 and in the research room 18. The 45 degree and 90 degree transport lines are built with 2 and 4 of these magnets, respectively. Research room transport lines are also built with 2 of these magnets, but they are powered to each produce a 30 degree bending angle.

The gantry optical interface 54 is designed to provide axially symmetric optics at the entrance point of rotation 56. The horizontal and vertical beta functions are made equal, and the alpha functions are both made equal to zero, at the rotation point 56. This matching is performed by three quadrupoles 58 placed between the transport line 52 and the gantry 54. The distances between the quadrupoles 58, and the strengths of two of them, are adjusted so that the matching conditions are satisfied.

Figure 3:
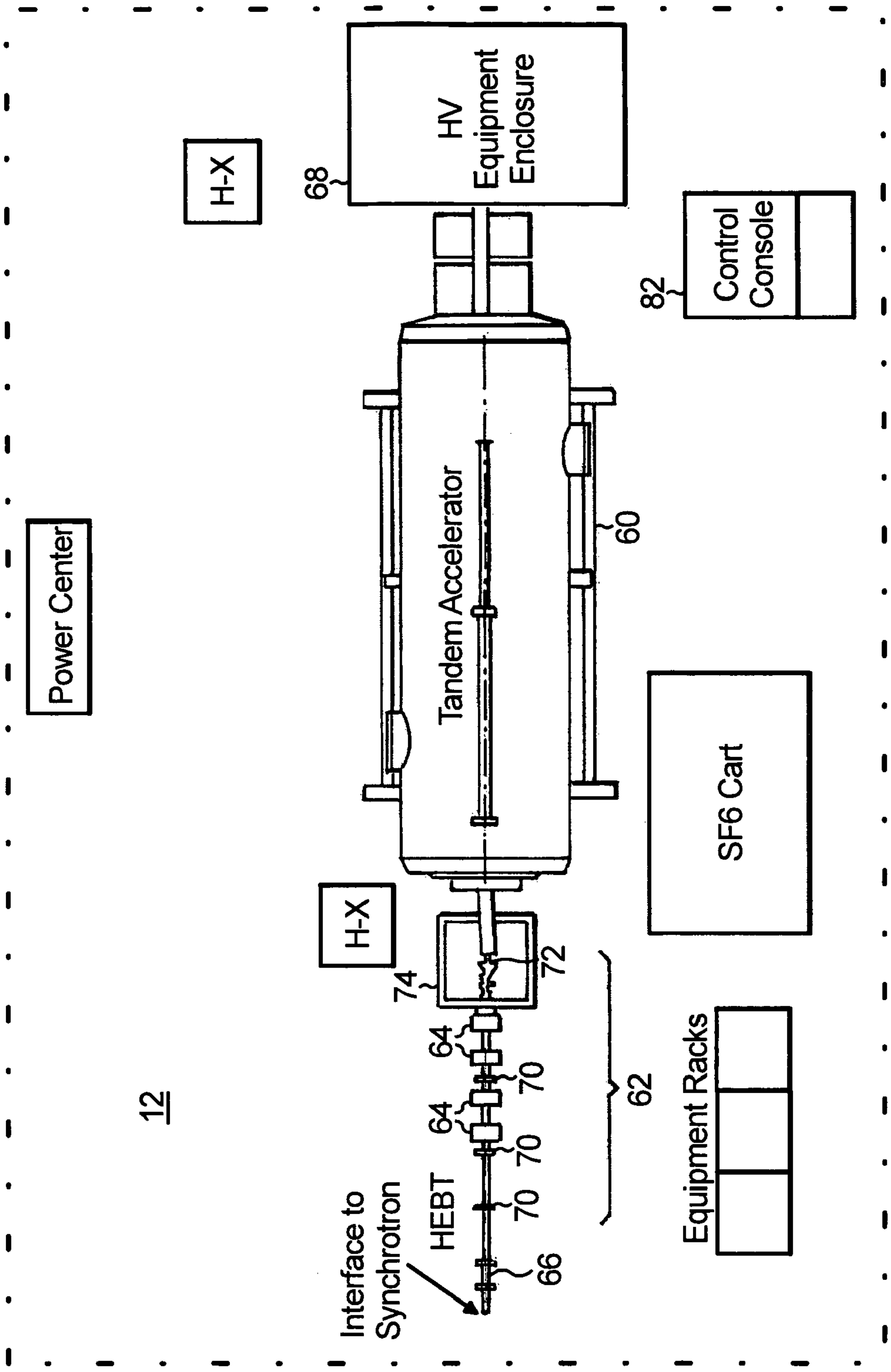
FIG. 3 is a top plan view of the injector shown in FIGS. 1 and 2.

FIG. 3 is a schematic view of the injector 12 of the present invention and its support equipment. Based upon the preferred beam delivery requirements for the injector as specified in Table 6 below, an electrostatic tandem configuration is preferred for the injector accelerator 60.

TABLE 6

| | |
|---|---|
| Repetition Rate, frep [Hz] | 30 |
| Synchrotron injection energy [MeV] | 7.0 |
| Normalized rms emittance, $\epsilon$ [μm] | 0.15 |
| Momentum width at injection (rms) $\sigma_p/p$ | 0.001 |
| Total momentum width, Δp/p | +/−0.0023 |
| Total kinetic energy width, ΔK [keV] | +/−32 |
| Injected pulse length Δt [ns] | 25-100 |
| Injected protons per pulse, min | $1.0 \times 10^7$ |
| Injected protons per pulse, max | $1.7 \times 10^9$ |
| Maximum pulse to pulse intensity variation | 6 |
| Overall length [m] | ~8.0 |
| Source current [mA] | 0.064-2.72 |

The injector preferably provides proton beam pulses at 30 Hz with a pulse width varying between 25 and 100 nanoseconds at a delivered energy of 7 MeV. The maximum beam current will be 2.71 mA resulting in a maximum charge per pulse of $1.7\times10^9$ protons. This requirement can be met with a tandem accelerator 60 using currently available technology. The cost of this type of accelerator is approximately one third of the cost of an equivalent RF driven accelerator.

The height of the proton beam centerline is preferably about 50 inches above the facility floor. This should match the height for injection into the synchrotron. The total length of the machine is preferably about 532 inches, using a straight High Energy Beam Transport (HEBT) section 62. The HEBT section 62 employs four quadrupole magnets 64 to match the circular output beam from the tandem accelerator 60 to the phase space requirements of the synchrotron 14. If facility requirements necessitate repositioning of the injector 12, a bend can be accommodated in the HEBT section 62. The bend would include the addition of one or more dipole magnets between the second and third quadrupole magnets 64 in the HEBT section 62.

Preferably, a beam diagnostics section 66 is located in the HEBT section 62 downstream of the quadrupoles 64. The diagnostics include a beam pulse charge integrator, a beam position monitor, two beam profile monitors, and a retractable Faraday cup. The arrangement and function of these diagnostics are described in more detail herein below.

The particles, which in the preferred embodiment are protons, are provided by an ion source located within a high voltage safety enclosure 68. The ion source is preferably a toroidal-discharge volume-production type. To provide intense pulses, the plasma arc power supply is a fast pulse driver. Its pulse width and drive current are adjustable to allow optimization of the injector efficiency at a given beam current level. Typically the arc driver pulse width will be set to a value somewhat larger than 100 microseconds to allow the beam current to reach a steady value before a second pulse driver connected to a set of electrostatic deflector plates allows the beam to pass to the accelerator section. This second driver will set the precise width between 25 and 100 nsec needed for operation. A preset delay between the two pulse drivers will prevent transient effects in the source pulsing from reaching the accelerator.

An extractor electrode is positioned about 5 mm from the anode aperture of the ion source. The relatively small opening in the extractor allows the assembly to be designed for differential vacuum pumping, thereby minimizing ion source gas streaming into the accelerator. Unwanted electrons are swept out of the extracted negative ion beam by means of a small dipole magnet located in this region. The beam is further accelerated to 20 keV by means of another downstream electrode.

An Einzel lens beyond the acceleration gap serves to focus the beam prior to pre-acceleration. A general-purpose electrostatic acceleration tube is provided between the Einzel lens and the main accelerator. In this region the beam energy is increased to 75 keV. Differential vacuum pumping is provided before and after the acceleration tube to further reduce any unwanted gas streaming into the accelerator.

A high voltage safety enclosure 68 is provided around all of the ion source power supplies. The door of the enclosure is interlocked to the power supplies by means of a mechanical system of high reliability that shorts the ion source equipment to ground if the door is opened.

De-ionized water is used in the coolant loop for the equipment located in the high voltage safety enclosure. This is temperature controlled by means of a water to water heat exchanger located near the HV enclosure.

The tandem accelerator 60 is enclosed within a pressure vessel containing $SF_6$ insulating gas at a pressure of 80 psig. The tank is preferably made of carbon steel and conforms to the standards of the ASME. Ports are provided for two windows, electrical feedthroughs, a generating voltmeter, a corona triode needle assembly, a capacitive pick off and $SF_6$ gas fill. The window ports are preferably large enough for personnel access to the inside of the tank for installation and servicing.

Inside the tank is a central charging system, an HV terminal containing the beam stripper and beam focusing magnets, and a pair of electrostatic acceleration columns. The negative ion beam from the source is accelerated to terminal voltage of 3.5 MV and stripped of electrons. The resulting positive ion beam is further accelerated to 7 MeV at the point that it leaves the tank. The HV terminal charging system utilizes two Pelletron™ chains. The HV terminal houses two foil stripper changers, each containing 25 foils. The acceleration tubes are preferably of an organic free design capable of withstanding high electrical gradients and are preferably designed to magnetically suppress unwanted electrons that are generated from stray proton bombardment of the acceleration tubes or from premature stripping from particle collisions.

The HEBT section 62 is a simple straight section from the output of the tandem accelerator 60 to the input of the synchrotron inflector **46*a*. The HEBT 62 contains four quadrupole magnets 64 for transitioning the proton beam from a circular configuration as it leaves the tandem accelerator 60 to the acceptance criteria of the synchrotron. A series of three X-Y steering magnets 70** are also provided to correct beam transmission.

A retractable Faraday Cup 72 is provided near the accelerator output along with a vacuum pumping station 74 that reduces unwanted gas streaming into the synchrotron 14. A vacuum isolation valve with a roughing port is preferably located just upstream of the mechanical interface with the synchrotron inflector **46*a*. A second retractable Faraday cup/beam stop (not shown) is preferably provided prior to injection into the synchrotron inflector 46*a***. This unit serves as a commissioning diagnostic as well as for daily checkout prior to normal operation.

Figure 4:
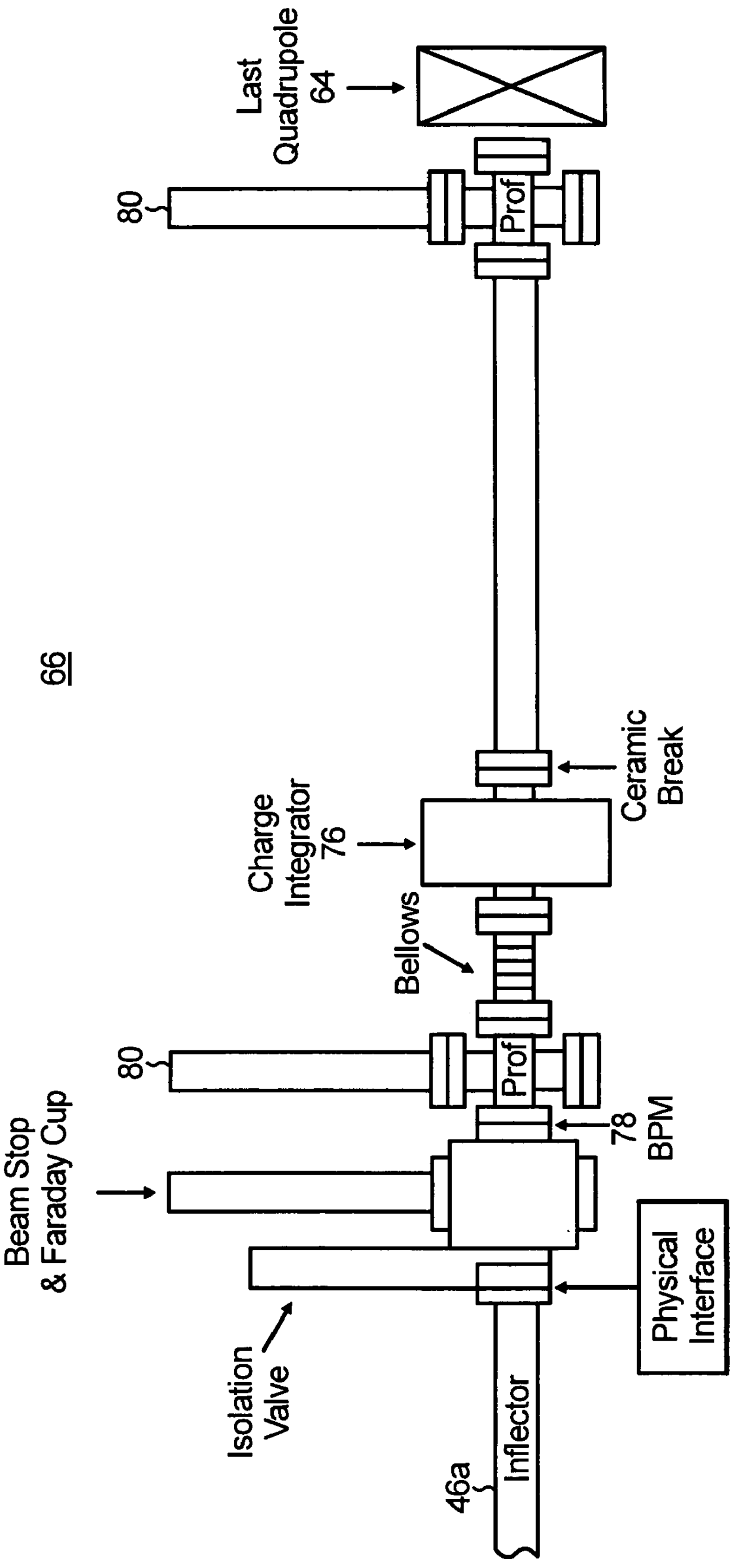
FIG. 4 is a plan view of the beam diagnostics section shown in FIG. 3.

The general arrangement of the beam diagnostics section 66 is shown in FIG. 4. A pulse charge integrator 76 serves as direct feedback to the control system to enable delivery of the prescribed patient treatment doses per voxel. A beam position monitor (BPM) 78 provides fine beam steering feedback while two beam profile monitors 80 permit a determination of the beam convergence/divergence at the entrance to the inflector 46*a* as well as beam size.

The beam diagnostic section 66 provided in the HEBT 62 provides the delivered beam characteristics that are fed back to an injector local control 82 (shown in FIG. 3) to maintain proper operation for patient treatment. The beam pulse charge integrator 76 is provided for pulse to pulse intensity control.

The injector control system 82 is preferably configured so that complete stand-alone local control and operation of the injector can be accomplished. The system 82 can include a local processor, such as a commercial PC class computer with hard disk capacity of at least 10 GB, a color monitor, a mouse and a printer. Injector parameters can be interfaced to localized controllers through optically isolated A/D, D/A and digital I/O modules. Each localized controller is preferably connected to the next unit in line or to the PC by a fiber optic link. The local processor is preferably connected to a Treatment Control System (TCS) by means of an Ethernet link and hardwire as necessary. The injector local processor receives beam pulse requirements (intensity, pulse number) from the Treatment Control System. During a treatment cycle, the measured key beam pulse characteristics will be stored in the local processor for later interrogation by the TCS.

Figure 5:
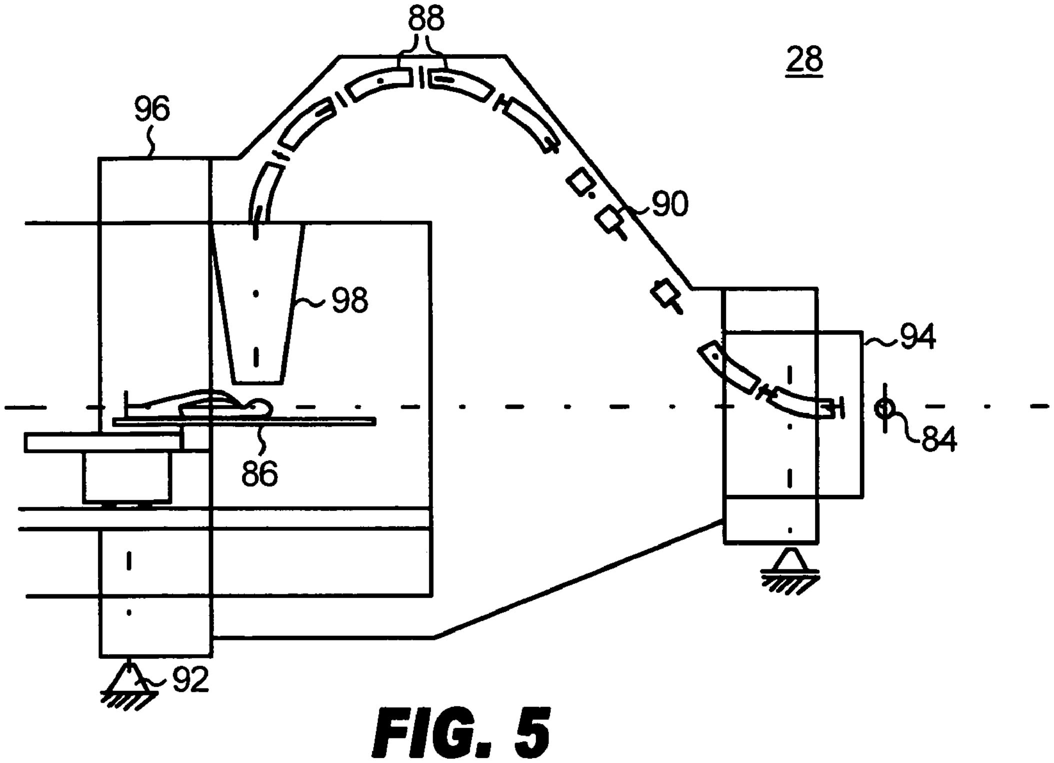
FIG. 5 is a side view of the arrangement of the gantry, magnets, nozzle and couch in a treatment room.

Turning to FIG. 5, the RCMS gantry 28 is shown in greater detail. The gantry 28 is preferably about 8 meters long, from the rotation point 84 to the iso-center 86, with a height of about 6 meters. The mechanical structure of the gantry 28 is preferably optimized for minimum deformation within a reasonable total weight of the total structure. The light magnets 88, 90 used in the RCMS gantry 28 are a significant advantage, in this regard. Table 7 lists the rigidity parameters and other principal parameters for the gantry 28.

TABLE 7

| | |
|---|---|
| Rigidity | |
| Deformation of the optical axis | +/−0.5 mm envelope to ideal optical beam path |
| Deviation of the angle of rotation | +/−0.1° |
| Weight | |
| Dipole 88 | 320 kg |
| Number of dipoles | 2 + 5 |
| Quadrupole 90 | 52 kg |
| Number of quadrupoles | 2 + 1 + 4 + 5 |
| Kinematics | |
| Range of gantry rotation movement | +/−800 (plus 20° overshoot) |
| Rotational speed | $\leqq 6°/s$ |
| Rotational acceleration | $\leqq 2°/s^2$ |
| Movement of patient table x, y, z directions, rotation around vertical axis | +/−95° |

The gantry 28 is constructed as a three-dimensional structure. On the treatment room side, the gantry 28 is supported by a fixed bearing 92 which supports axial and radial loads. On the beam inlet side, the structure 28 is supported by a bearing 94 allowing axial displacement (movable bearing). Thus, the gantry 28 is fixed in the axial direction at the treatment room bearing 92, with thermal expansion compensated by the bearing 94 near the beam inlet. The gantry 28 is further preferably balanced around its rotation axis. The cables and wires necessary for the operation of the beam guide elements are preferably guided by means of a cable twister.

Gantry movement is realized by a gear motor/gear ring drive 96 that allows high precision positioning. Each gantry 28 is preferably controlled by means of an individual independent computer unit that ensures mutual braking of the main drive units, soft start and soft deceleration functions, control of the auxiliary drive units for the treatment room, and supervision of the limit switches. The nominal position of the gantry is defined via an interface to the Treatment Control System for that room.

Figure 6:
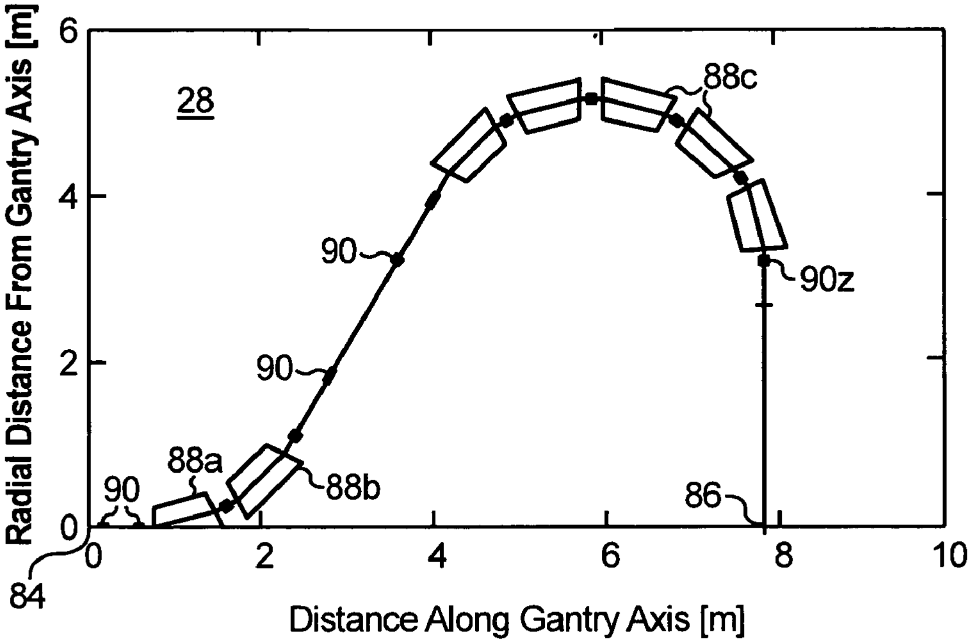
FIG. 6 is a graphical representation of the magnet layout in the gantry, with a total of seven 30° bending magnets and 12 quadrupole magnets.

Referring additionally to FIG. 6, each gantry dipole magnet 88 deflects the beam by 30 degrees, maximizing the “packing factor” (the ratio of integrated dipole length to the total length) in the arc. The gantry 28 preferably has a free space of more than 3 meters from the last magnet to the isocenter 86. In order to make the beam transport through the gantry 28 independent of the gantry rotation angle, the horizontal and vertical beta functions of the magnets 88, 90 are made identical at the input rotation point 84, and the slopes of the beta functions are made zero. The dispersion function and its slope must also be zero at the rotation point 84.

Two quadrupoles 90 between the rotation point 84 and the first gantry dipole 88*a* adjust the beta functions to be nearly periodic, thus providing the minimum beam size throughout the magnet region. The “bridge” between the first set of dipoles 88*a*, 88*b* (bending the beam up) and the second set of dipoles 88*c* (bending the beam back to the iso-center) contains four quadrupoles 90, keeping the beta functions small while providing the right phase advance to match the dispersion to zero at the end of the gantry.

The gantry includes a nozzle 98 following the last quadrupole 90*z*. The nozzle 98 can be either a passive scattering or a spot scanning nozzle. Two scanning magnets with a magnetic length of 30 cm and a field of 0.8 T provide a scanning field of +/−20 cm. The positioning of the scanning magnets downstream of the arc dipoles allows for small aperture magnets upstream, keeping the total weight of magnets on the gantry down to less than 3 tons. While the optics shown in FIGS. 5 and 6 is optimized to produce a round beam at the first scattering target of a scattering nozzle, the strength of the last quadrupole 90*z* can be varied to provide a smaller horizontal beam size at the iso-center 86. It is also possible to add advanced imaging facilities, such as a PET camera or a proton radiography system, to the nozzle 98.

Returning to FIG. 2, the voltage for bunch stability and acceleration is provided by one ferrite loaded RF cavity 42 with two gaps, driven by a commercially available solid state amplifier. During the 15-17 ms acceleration cycle the radio frequency increases from about 1.2 MHz to 6.0 MHz, a high speed frequency swing at a 30 Hz repetition rate that drives the design of the RF system. Basic RF parameters are shown in Table 8.

TABLE 8

| | |
|---|---|
| Repetition rate, $f_{rep}$ [Hz] | 30 |
| Harmonic number, h | 1 |
| Frequency range, $F_{RF}$ [MHz] | 1.188-6.002 |
| Number of cavities | 1 |
| Number of gaps | 2 |
| Maximum total gap voltage, $V_{RF}$ [kV] | 7.5 |
| Number of solid state amplifiers | 4 |
| Power per amplifier [kW] | 5 |

Figure 7:
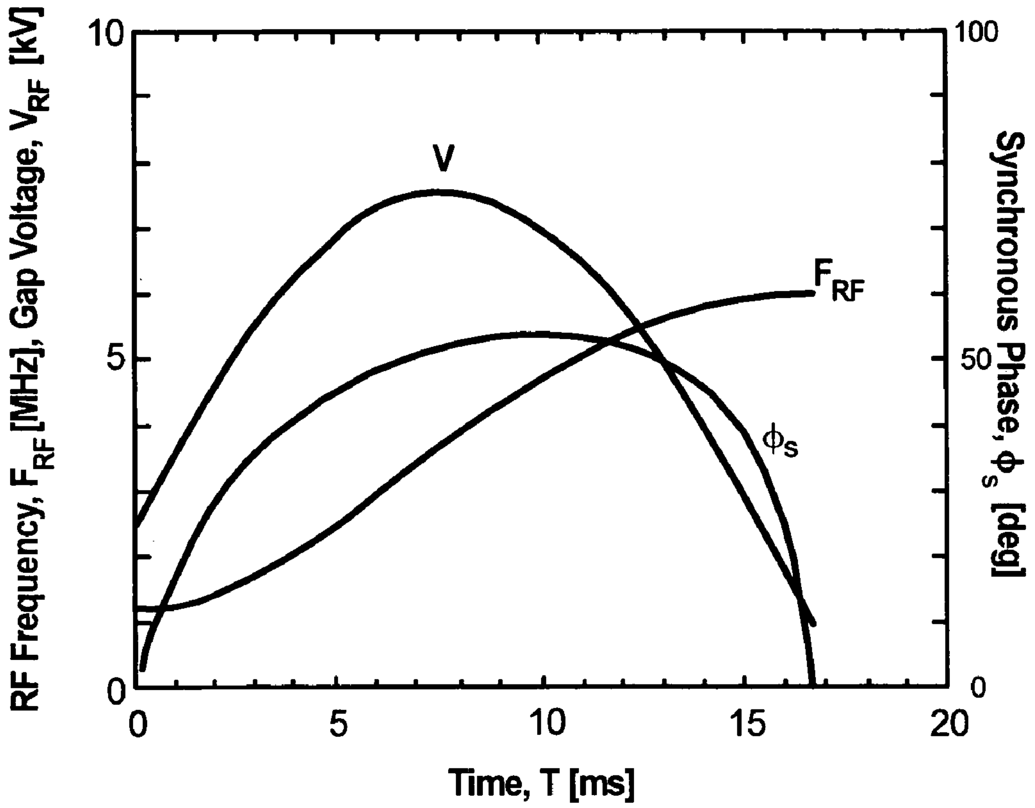
FIG. 7 is a graph showing the RF frequency $F_{RF}$, RF gap voltage $V_{RF}$ and synchronous RF phase $\Phi_s$ of the RF system during acceleration.
Figure 8:
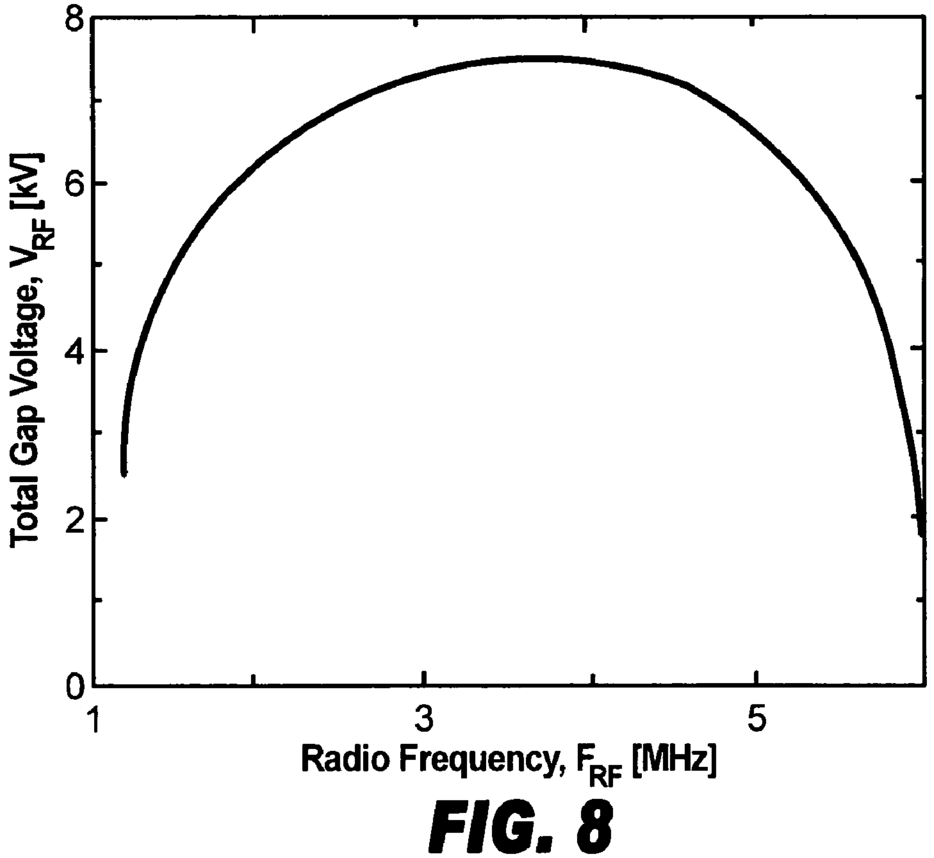
FIG. 8 is a graph showing the total gap voltage $V_{RF}$ as a function of RF frequency FR for the RF system of the present invention.
Figure 9:
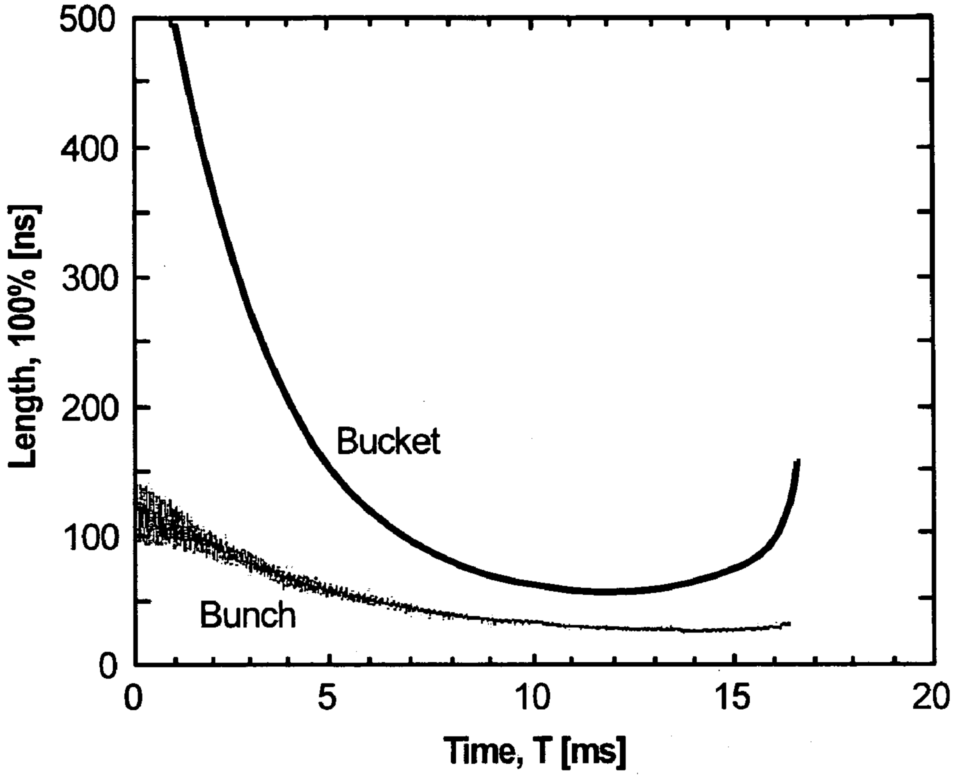
FIG. 9 is a graph showing full bucket and bunch length during acceleration for the RF system of the present invention.
Figure 10:
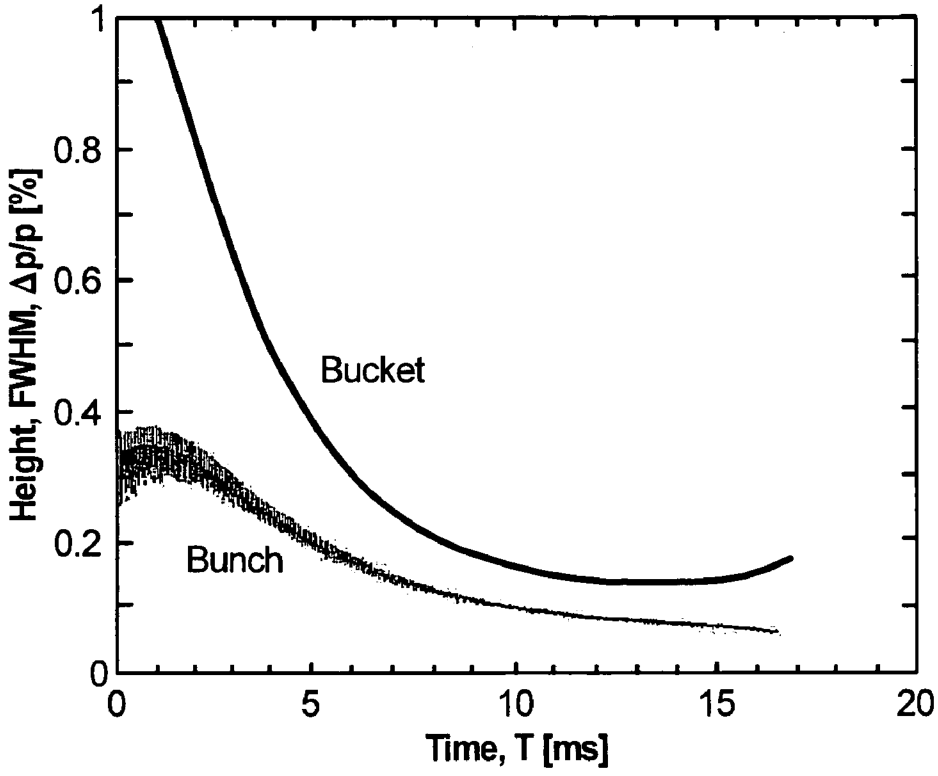
FIG. 10 is a graph showing FWHM momentum acceptance and momentum spread for the RF system of the present invention.
Figure 11:
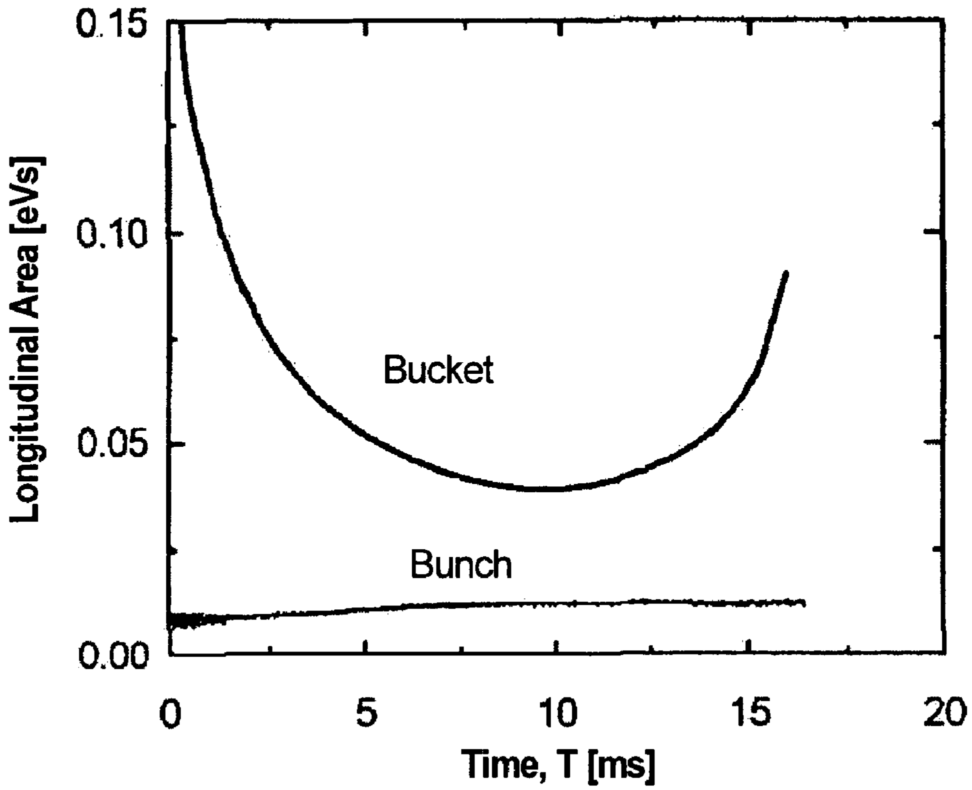
FIG. 11 is a graph showing bucket and bunch area during acceleration for the RF system of the present invention.

The RF frequency follows the increasing speed of the protons as they are accelerated. The synchronous phase $\Phi_s$ is given by the ramp rate and stays below 52 degrees throughout the acceleration cycle. The RF voltage at injection is tuned to match the longitudinal profile of the injected bunch. Along the energy ramp, the voltage is increased to provide a bucket area sufficiently larger than the bunch area to minimize beam losses. This is accomplished through the sinusoidal voltage function:

$$V_{acc}\,[\text{kV}]=7.5\,\sin(2\pi(t\,[\text{ms}]/37.3)+0.201 \text{ for } 0<t<16.7\,[\text{ms}]$$

where the maximum accelerating voltage of $V_{RF}$=7.5 kV is reached after approximately 8 ms. FIGS. 7 and 8 show the RF voltage, frequency and synchronous phase during acceleration, while FIGS. 9, 10 and 11 show the bucket and bunch dimensions during acceleration. The bucket length, momentum acceptance and area are computed analytically. The bunch length, momentum width and area are obtained from a 10,000-particle simulation including space charge. The RF parameters are tuned to always provide bucket area sufficiently larger than the bunch to minimize beam losses.

Figure 12:
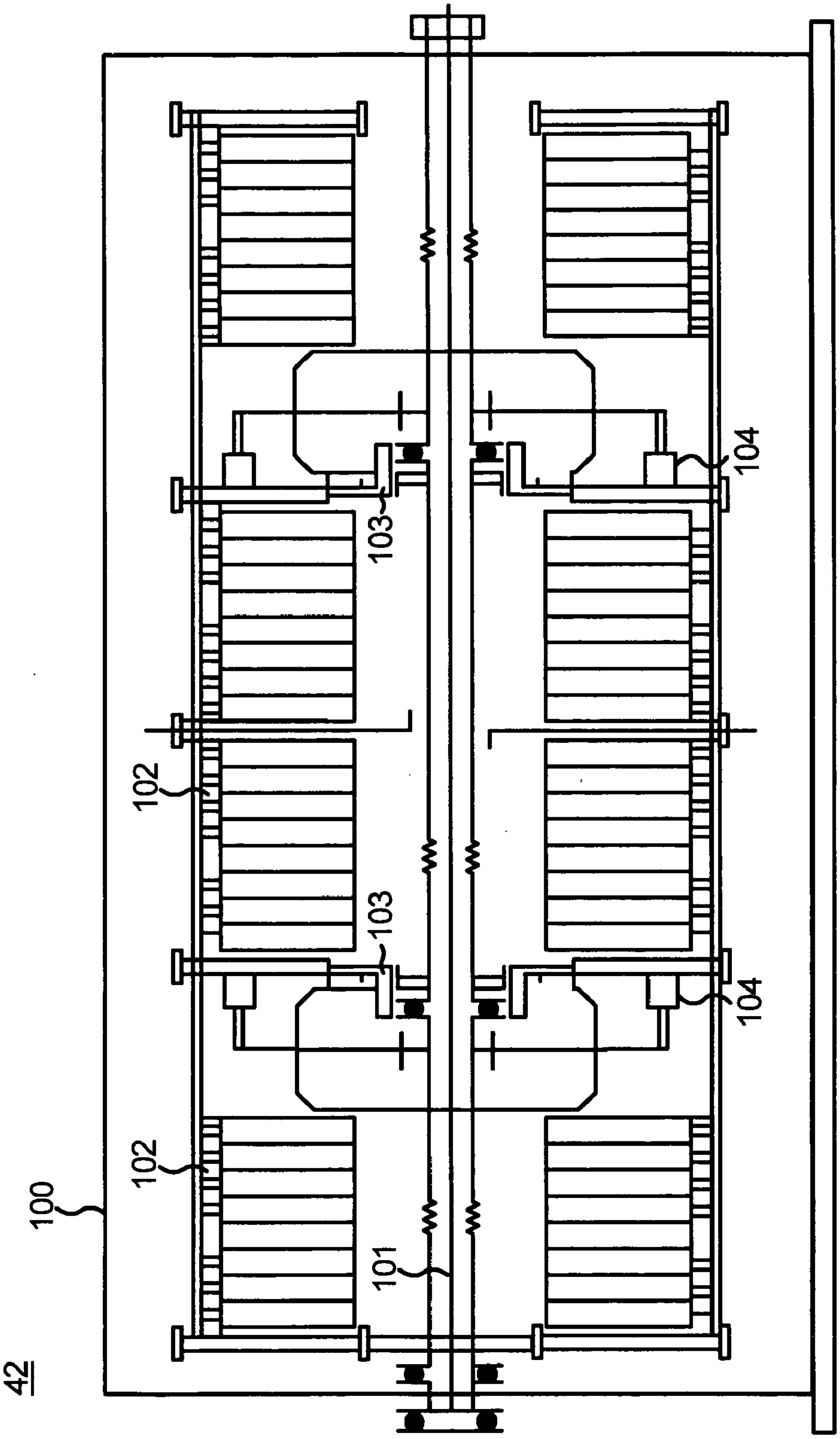
FIG. 12 is a top cross-sectional view of the RF cavity of the present invention.
Figure 13:
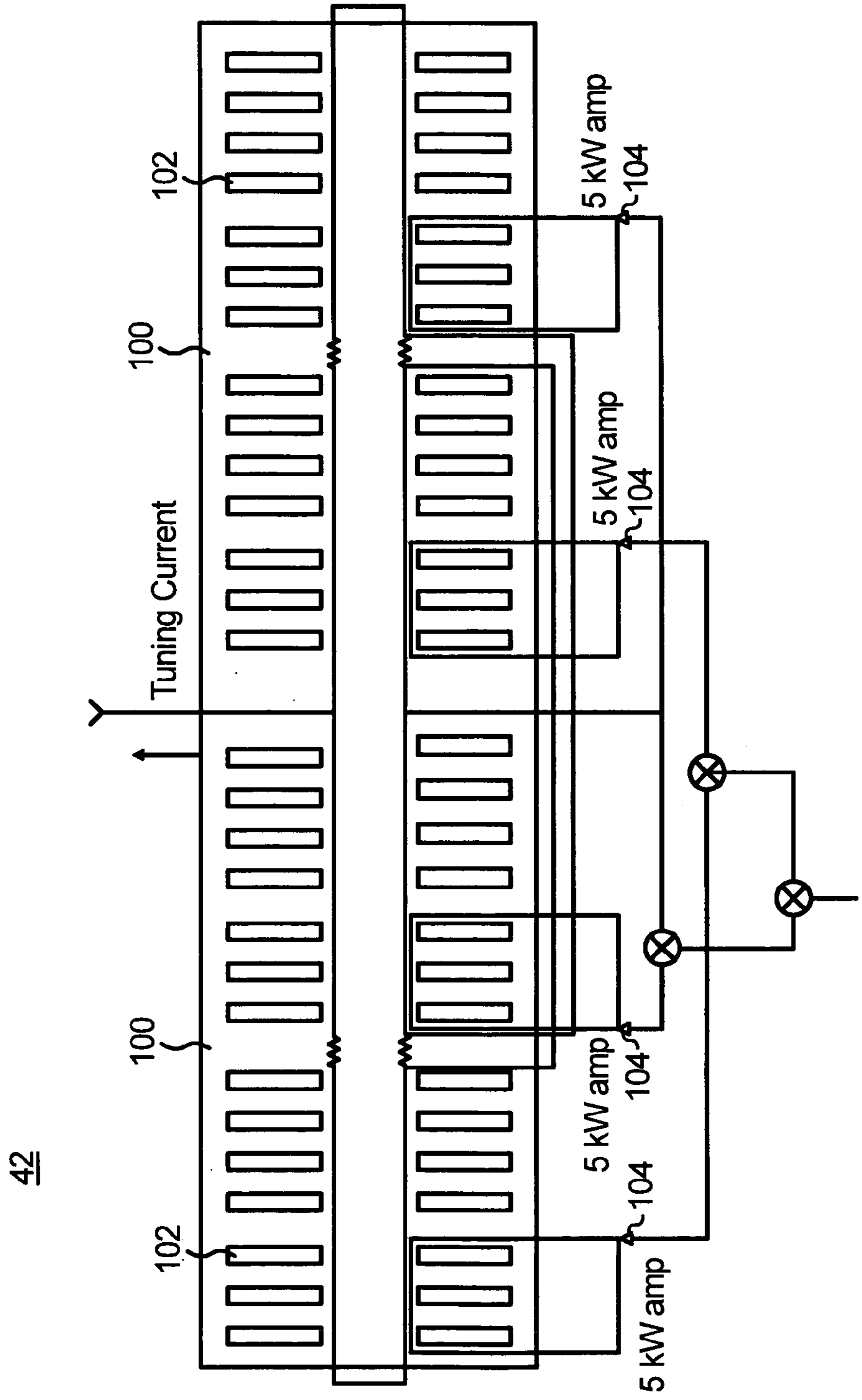
FIG. 13 is a schematic diagram showing the electrical tuning loops and amplifiers of the RF cavity shown in FIG. 12.
Figure 14:
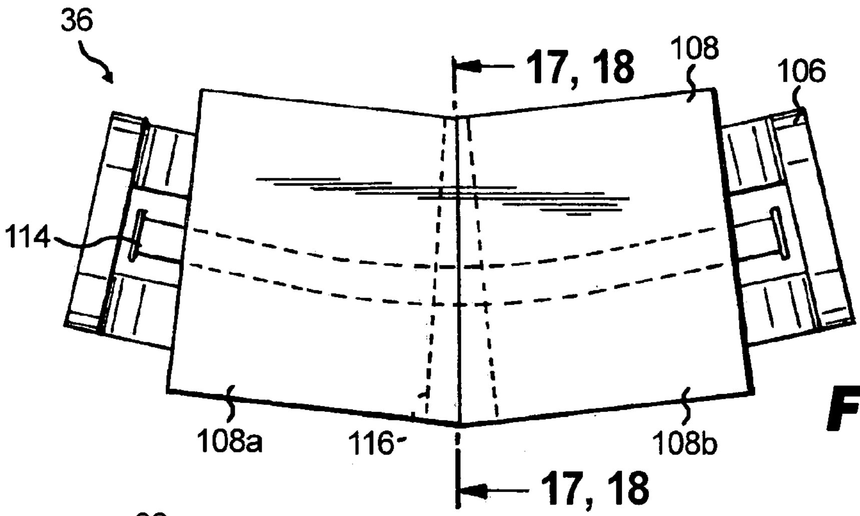
FIG. 14 is a top plan view of the combined function magnet of the present invention.
Figure 15:
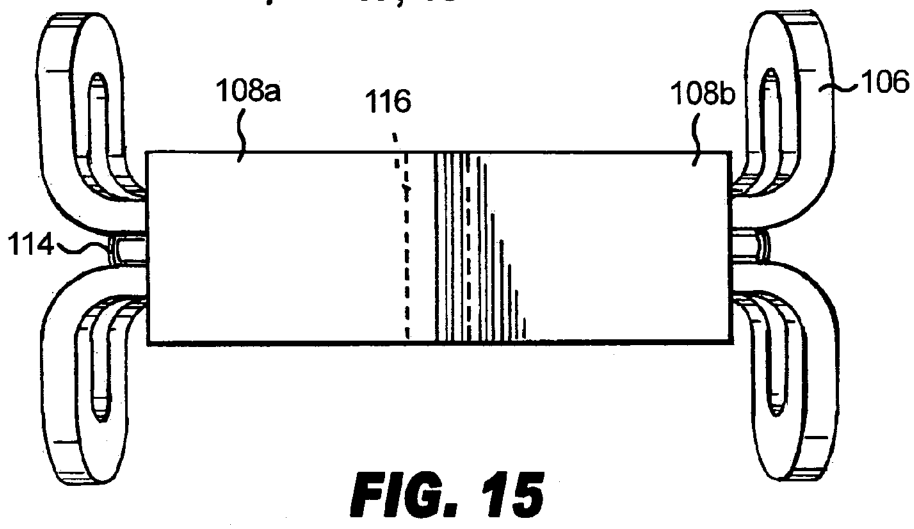
FIG. 15 is a side plan view of the combined function magnet shown in FIG. 14.
Figure 16:
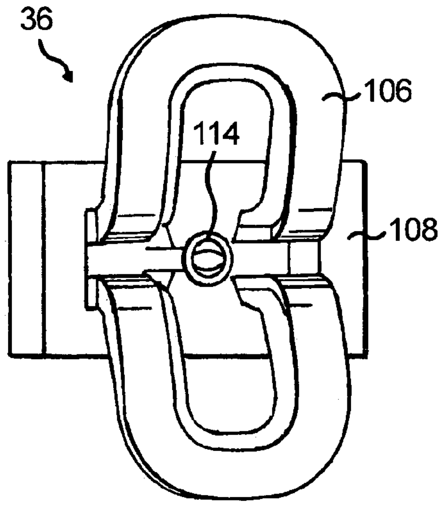
FIG. 16 is an end view of the combined function magnet shown in FIG. 14.

Referring to FIGS. 12 and 13, the RF cavity 42 for providing the RF voltage includes a housing 100 having a beam pipe 101 centrally disposed therein. The housing 100 is loaded with twenty-eight rings 102 of 4L2 or 4M2 ferrite surrounding the beam pipe 101. The beam pipe 101 has two longitudinal discontinuities or gaps 103 and fourteen ferrite rings 102 are associated with each gap. An electric field is applied across the gaps 103 to accelerate the particles in the beam pipe 101.

The rings 102 preferably have an inner diameter of 18 cm, an outer diameter of 50 cm, and are 2.5 cm thick. Each ring 102 preferably has an inductance of $L_0$=1.175 μH at zero frequency, and L=0.063 μH at 6 MHz. The magnetic field in the ferrite preferably does not exceed 15 mT and the capacitance of a gap 100 is approximately C=100 pF. The cavity is tuned dynamically in a push-pull configuration, at the 30 Hz repetition rate, and operated on resonance at all times. In this way, the drive power is minimized. The tuning current is DC coupled and ranges from zero to 1500 A. Two 5 kW solid state amplifiers 104 per gap provide the necessary RF power. The configuration of the tuning current is shown in the electrical schematic drawing of FIG. 13.

The low level RF system is a state-of-art digital system. Drive frequencies are generated in Direct Digital Synthesizers (DDS), with a time resolution equivalent to frequencies of up to 32 MHz. RF voltages and frequencies are preferably set in open loops. Corrections are made in a feed-forward manner, from cycle to cycle. For example, a fraction of the measured phase error can be applied in the next cycle so as to eliminate the phase error over time. The RF can be switched off within 10 μs of the receipt of a beam-inhibit signal, dumping any beam that is currently in the synchrotron, and disabling the acceptance of beam on following acceleration cycles.

As mentioned above, four different types of magnet are used in the RCMS synchrotron, beam delivery lines, and treatment rooms: combined function magnets, dipoles, quadrupoles, and dipole correctors. The main combined function magnets and the dipoles are responsible for bending the beam through a large angle (for example, 30° in the gantries), while the quadrupoles keep the beam focused in the beam delivery lines and treatment rooms. The relatively weak dipole correctors are used to keep the beam going down the middle of the beam pipe. Sextupole magnets are not required in the RCMS. Table 9 lists a preferred distribution of the 3 different kinds of bending magnets, two kinds of quadrupole magnets, and three kinds of dipole corrector magnets that are used in a typical facility. (DS=synchrotron combined function magnet; DT=transport dipole; DG=gantry dipole; QS=synchrotron quadrupole; QG=gantry quadrupole; DCH=synchrotron horizontal corrector dipole; DCV=synchrotron vertical corrector dipole; and DCG=gantry corrector dipole.)

TABLE 9

| | DS | DT | DG | QS | QG | DCH | DCV | DCG |
|---|---|---|---|---|---|---|---|---|
| Synchrotron | 14 | | | 10 | | 4 | 4 | |
| Extraction | | 1 | | | 3 | | | |
| Research Room | | 2 | | | 4 | | | 2 |
| Fixed vertical | | 2 | 7 | | 21 | | | 6 |
| Fixed horz. 1 | | 4 | | | 7 | | | 2 |
| Fixed horz. 2 | | 4 | | | 8 | | | 4 |
| Gantry 1 | | 2 | 7 | | 21 | | | 6 |
| Gantry 2 | | 2 | 7 | | 25 | | | 8 |
| Gantry 3 | | 2 | 7 | | 25 | | | 8 |
| Gantry 4 | | 2 | 7 | | 25 | | | 8 |
| TOTAL | 14 | 21 | 35 | 10 | 139 | 4 | 4 | 44 |

Table 10 lists the major parameters for the DS, DT, and DG dipoles that are preferably used in the synchrotron, transport lines, and gantry, respectively.

TABLE 10

| | Synch (DS) | Transp (DT) | Gantry (DG) |
|---|---|---|---|
| Magnet type | H-type | H-type | H-type |
| Magnet shape | chevron | chevron | sector |
| Dipole bend angle [deg] | 25.714 | 22.5 | 30 |
| Dipole bend radius [m] | 1.693 | 1.693 | 1.5278 |
| Dipole sagitta [mm] | 10.6 | 8.2 | 0 |
| Magnetic length [m] | 0.760 | 0.665 | 0.80 |
| Physical length [m] | 0.845 | 0.750 | 0.82 |
| Max. field (top) [T] | 1.44 | 1.44 | 1.59 |
| Max. dB = dt [T/s] | 228 | 0.053 | 0.032 |
| Inductance [mH] | 0.766 | 0.67 | 3.9 |
| Resistance (DC) [mΩ] | 1.0 | 0.9 | 1.1 |
| Resistance (AC) [mΩ] | 1.0 | N/A | N/A |
| Max. current [A] | 2569 | 2569 | 871 |
| Gap width [mm] | 60 | 60 | 40 |
| Gap height [mm] | 30 | 30 | 20 |
| Magnet weight [kg] | 410 | 360 | 320 |

The synchrotron combined function magnet 36 shown in FIGS. 14-18 includes two saddle coils 106 fabricated from commercially available water-cooled bus wound in seven turns with a 30 mm vertical gap therebetween. The magnet 36 further includes a magnet core 108 made from a plurality of iron laminates 110, 112 and an elliptical beam pipe 114 centrally positioned between the coils 106 and the laminates 110, 112. The coils 106, laminates 110, 112 and beam pipe 114 are arranged in a "chevron" geometry to achieve the desired bend angle in the synchrotron. This chevron geometry can be achieved by stacking the laminates 110, 112 to form two magnet core sections 108*a* and 108*b* with a wedge positioned therebetween. The magnet 36 is thus bent in an arcuate shape defined by a center of magnet curvature 115, which falls in the center of the arc section 32 of the synchrotron 14.

Figure 17A:
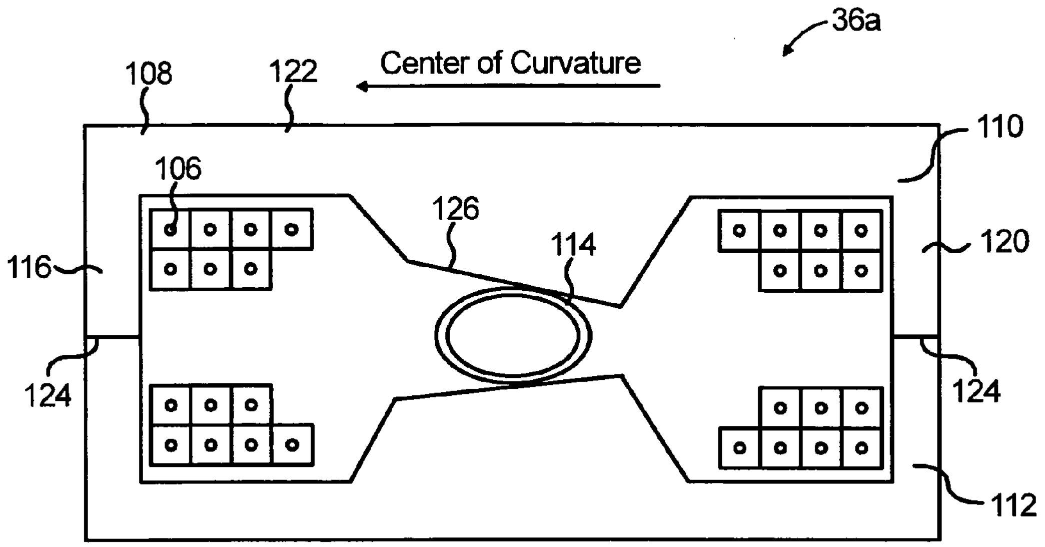
FIG. 17*a* is a cross-sectional view of a focusing combined function magnet of the present invention.
Figure 17B:
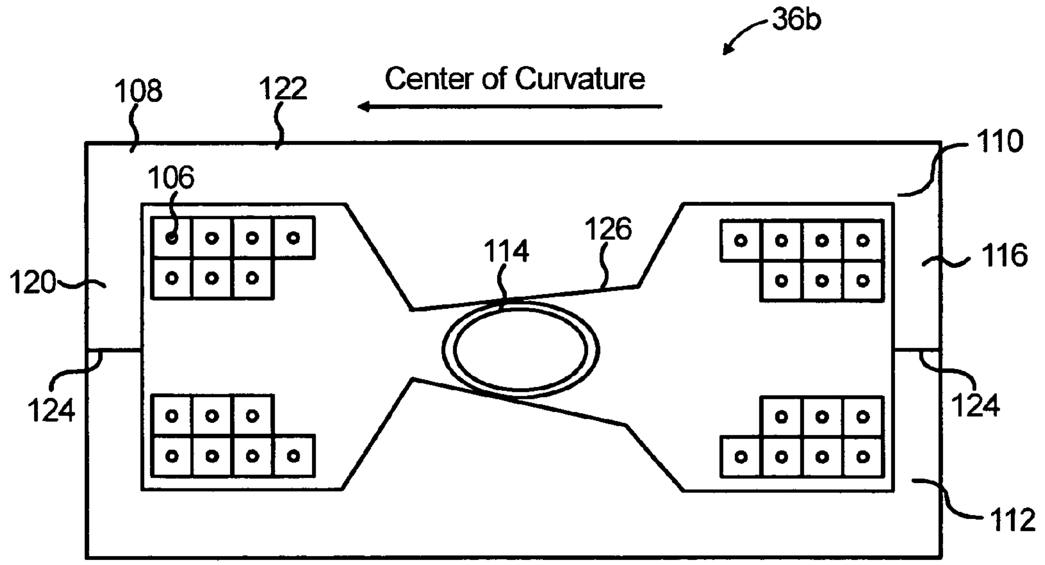
FIG. 17*b* is a cross-sectional view of a defocusing combined function magnet of the present invention.

As mentioned above, each synchrotron combined function magnet 36 is a combined function arc magnet combining the functions of bending the particle beam and focusing or defocusing the particle beam. The bending function is achieved by the curvature of the magnet, while the focusing or defocusing function is achieved by the arrangement of the iron laminates 110, 112 making up the magnet core 108. In particular, as shown in FIGS. 17*a* and 17*b*, the magnet core 108 is made up of a plurality of upper laminates 110 and lower laminates 112 assembled together respectively above and below the beam tube 114. The upper and lower laminates 110, 112 are identical in cross-section, but are arranged around the beam pipe 114 to form either a focusing combined function magnet (F) 36*a*, as shown in FIG. 17*a*, or a defocusing combined function magnet (D), as shown in FIG. 17*b*.

Figure 19:
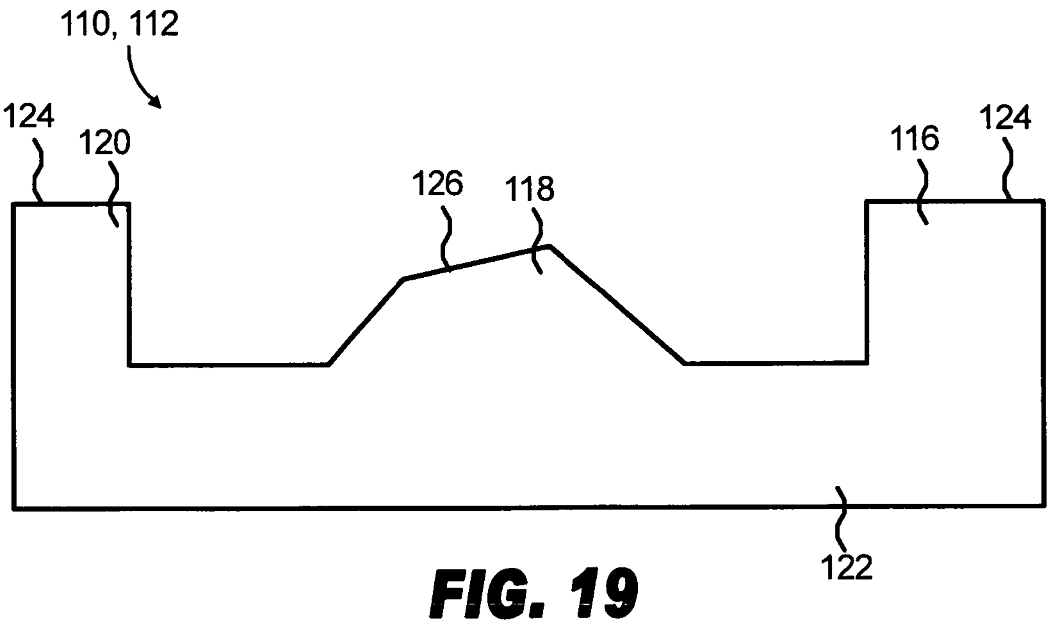
FIG. 19 is a plan view of one of the laminates making up the magnet core of the combined function magnet of the present invention.

As shown in further detail in FIG. 19, the laminates 110, 112 are generally E-shaped having three arms 116, 118 and 120 extending perpendicular from a base 122. The two outer arms 116 and 120 are generally rectangular in shape and terminate at an end 124, which is parallel to the base 122. The middle arm 118 extends from the base 122 between the outer arms 116 and 120 and terminates at an end 126, which is formed at an angle with respect to the base 122. In a preferred embodiment, the end 126 of the middle arm 118 is at an angle of about 5°-10° with respect to the base 122.

Figure 18:
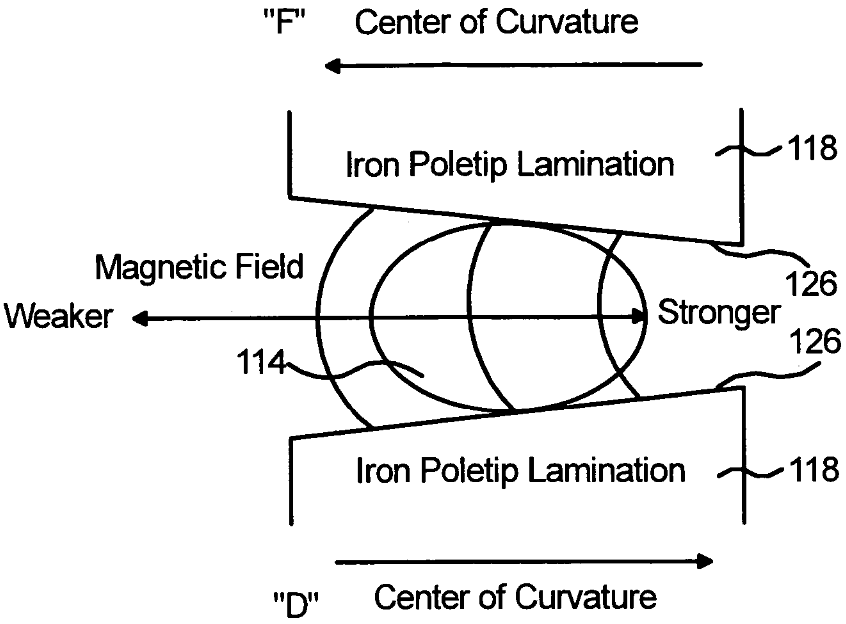
FIG. 18 is a schematic diagram illustrating the focusing/defocusing arrangement of the magnet core laminates.

Upon assembly, the laminates are stacked face to face along the length of the beam pipe 114 so that the ends 124 of the outer arms 116 and 120 of an upper laminate 110 abut against the ends 124 of the outer arms 116 and 120 of a lower laminate 112. In this manner, the coils 116 are positioned between the outer arms 116 and 120 and the middle arm 118 and the beam pipe 114 is positioned between facing angled ends 126 of the middle arm. As can be seen in FIGS. 17*a*, 17*b* and 18, depending on how the laminates are stacked, the magnet can be made a focusing combined function magnet (F) 36*a*, as shown in FIG. 17*a*, or the magnet can be made a defocusing combined function magnet (D) 36*b*, as shown in FIG. 17*b*.

A focusing combined function magnet (F) has laminates arranged so as to provide a magnetic field in the beampipe 114 which grows weaker in a direction toward the center of magnet curvature 115, whereas a defocusing combined function magnet (D) has laminates arranged so as to provide a magnetic field in the beam pipe which grows stronger in a direction toward the center of magnet curvature 115, as shown in FIG. 18. Thus, in a focusing combined function magnet 36*a*, a proton, or other particle, in the beam pipe horizontally further from the magnet center of curvature 115 is subject to a stronger magnetic field and bends more, while a proton closer to the magnet center of curvature sees a weaker magnetic field and bends less. This results in a greater horizontal concentration of protons, but a weaker vertical concentration of protons in the beam pipe just downstream of a focusing combined function magnet. Conversely, in a defocusing combined function magnet, a proton in the beam pipe horizontally further from the magnet center of curvature 115 is subject to a weaker magnetic field and bends less, while a proton closer to the magnet center of curvature sees a stronger magnetic field and bends more. This results in a more dispersed horizontal concentration of protons, but a denser vertical concentration, in the beam pipe just downstream of a defocusing combined function magnet.

To assemble a horizontally focusing combined function magnet (F) 36*a*, the angled ends 126 of the middle arm 118 are positioned to form an angle whose intersection point falls on the side of the beam pipe 114 facing away from the magnet's center of curvature 115, as shown in FIG. 17*a*. In other words, the middle arms 118 of the upper and lower laminates 110 and 112 in a focusing magnet are closest adjacent the outer arc of the beam pipe 114, with respect to the center of curvature 115 of the beam pipe. Conversely, to assemble a defocusing combined function magnet (D) 36*b*, the angled ends 126 of the middle arm 118 are positioned to form an angle whose intersection point falls on the side of the beam pipe 114 facing toward the magnet center of curvature 115, as shown in FIG. 17*b*. In other words, the middle arms 118 of the upper and lower laminates 110 and 112 in a defocusing magnet are closest adjacent the inner arc of the beam pipe, with respect to the center of beam pipe curvature 115.

Returning briefly to FIG. 2, the thus assembled focusing and defocusing combined function magnets 36*a* and 36*b* are alternately arranged in sequence along the arc section 32 of the synchrotron 14. Such alternate arrangement of the focusing and defocusing combined function magnets 36*a* and 36*b* provides to the present invention the feature of net strong particle beam focusing in both horizontal and vertical planes.

Figure 20:
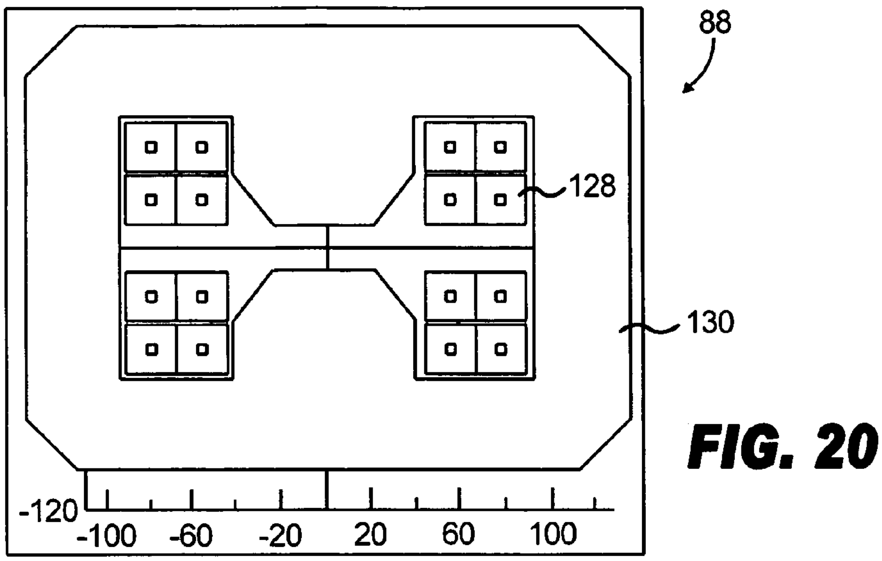
FIG. 20 is a cross-sectional view of a gantry magnet of the present invention.
Figure 21:
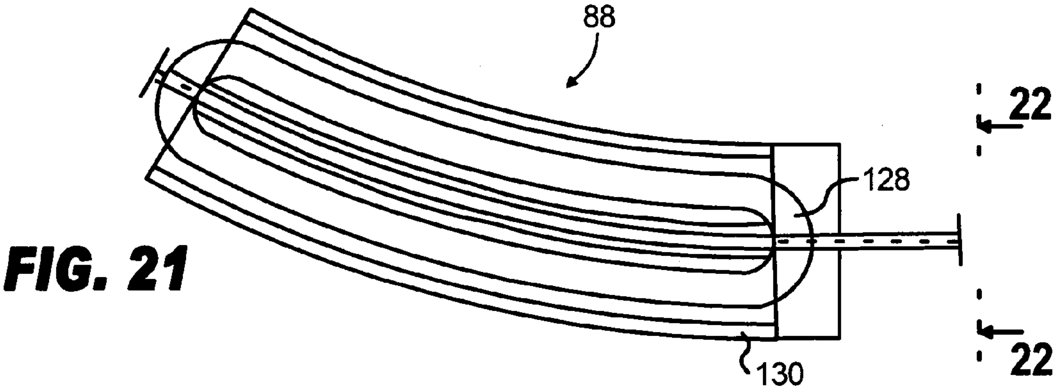
FIG. 21 is a plan view of a gantry magnet of the present invention.
Figure 22:
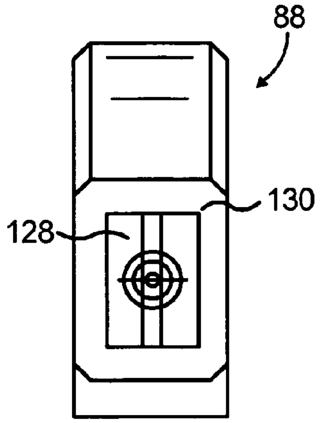
FIG. 22 is an end view of a gantry magnet of the present invention.

The beam transport dipoles are similar in design to the synchrotron combined function magnets 36, whereas the gantry dipoles 88 are shown in FIGS. 20-22. The gantry dipole 88 utilizes a water-cooled coil 128 with a tube/plate method of heat transfer. This dipole 88 has a solid core 130 design.

Table 11 lists the major parameters for the two kinds of preferred quadrupole magnets used primarily in the synchrotron (QS) and in the gantry (QG). The synchrotron quadrupole contains a water-cooled coil which uses the tube/plate method cooling method, and also uses a laminated core design. The gantry quadrupole maintains its temperature via a water-cooled bus, fabricated from commercially available copper bus. This quadrupole has a solid core design and is mounted in tandem with the neighboring DG dipole.

TABLE 11

| | Synch (QS) | Gantry (QG) |
|---|---|---|
| Magnetic length [m] | 0.14 | 0.06 |
| Physical length [m] | 0.26 | 0.166 |
| Inner radius [m] | 0.020 | 0.01 |
| Max. pole tip field (top) [T] | 0.5 | 0.8 |
| Max. gradient [T/m] | 23.8 | 35 |
| Gap radius [mm] | 15 | 10 |
| Max. current [A] | 500 | 100 |
| Number of turns per pole | 8 | 8 |
| Inductance [mH] | 0.065 | 0.25 |
| Resistance (DC) Ω | 0.9 | 0.5 |
| Resistance (AC) Ω | 1.0 | N/A |
| Magnet weight [kg] | 52 | 25 |

Preferred dipole corrector parameters are listed in Table 12. All dipole correctors are preferably air-cooled. The synchrotron dipole corrector cores are laminated. Two types of correctors (vertical and horizontal) are preferred in the synchrotron, in order to accommodate the oval beam tube. The gantry design contains a single corrector type allowed by the gantry's round beam tube.

TABLE 12

| | DCG Gantry | DCH Synch Horz | DCV Synch Vert |
|---|---|---|---|
| Gap Height (iron to iron) [mm] | 22 | 32 | 52 |
| Width [mm] | 60 | 90 | 70 |
| Iron length [mm] | 100 | 100 | 100 |
| Physical length [m] | 0.15 | 0.15 | 0.15 |
| Integrated Field [Tm] | 0.0073 | 0.0073 | 0.0073 |
| Inductance [mH] | 1.60 | 3.5 | 4.3 |
| Resistance (DC) [mΩ] | 0.1 | 0.16 | 0.26 |
| Max. current [A] | 15 | 15 | 15 |
| Power [W] | 22.5 | 36 | 58.5 |

The main magnet power supply of the RCMS is preferably a single 30 Hz series resonant power supply that drives all 14 combined function magnets in series. Such systems are extremely reliable because of their simplicity. Besides their simplicity, resonant power supplies have the major advantage of continuously exchanging stored energy between the magnets and capacitors, with the power supply providing only the losses. This makes them very economical to operate. It also greatly reduces the power line swing, when compared to a rapid cycling programmable power supply. The large variations in reactive power flow that otherwise occur cause voltage flicker problems, which can be very costly to solve.

The power supply generates a current of the form:

$$I_m(t)=I_{dc}-I_{ac}\cos(2\pi ft)$$

where a direct current bias of $I_{dc}$=1480 Amps is added to the sinusoidal alternating current ($I_{ac}$=1090 Amps) to ensure that the minimum current matches the required field at injection. Beam is injected into the ring at t=0 when I=390 Amps. Beam is extracted sometime before t=16.66 ms when $I_m(t)$ =2570 Amps. Except for iron saturation effects, the beam momentum is directly proportional to the main magnet current.

Figure 23:
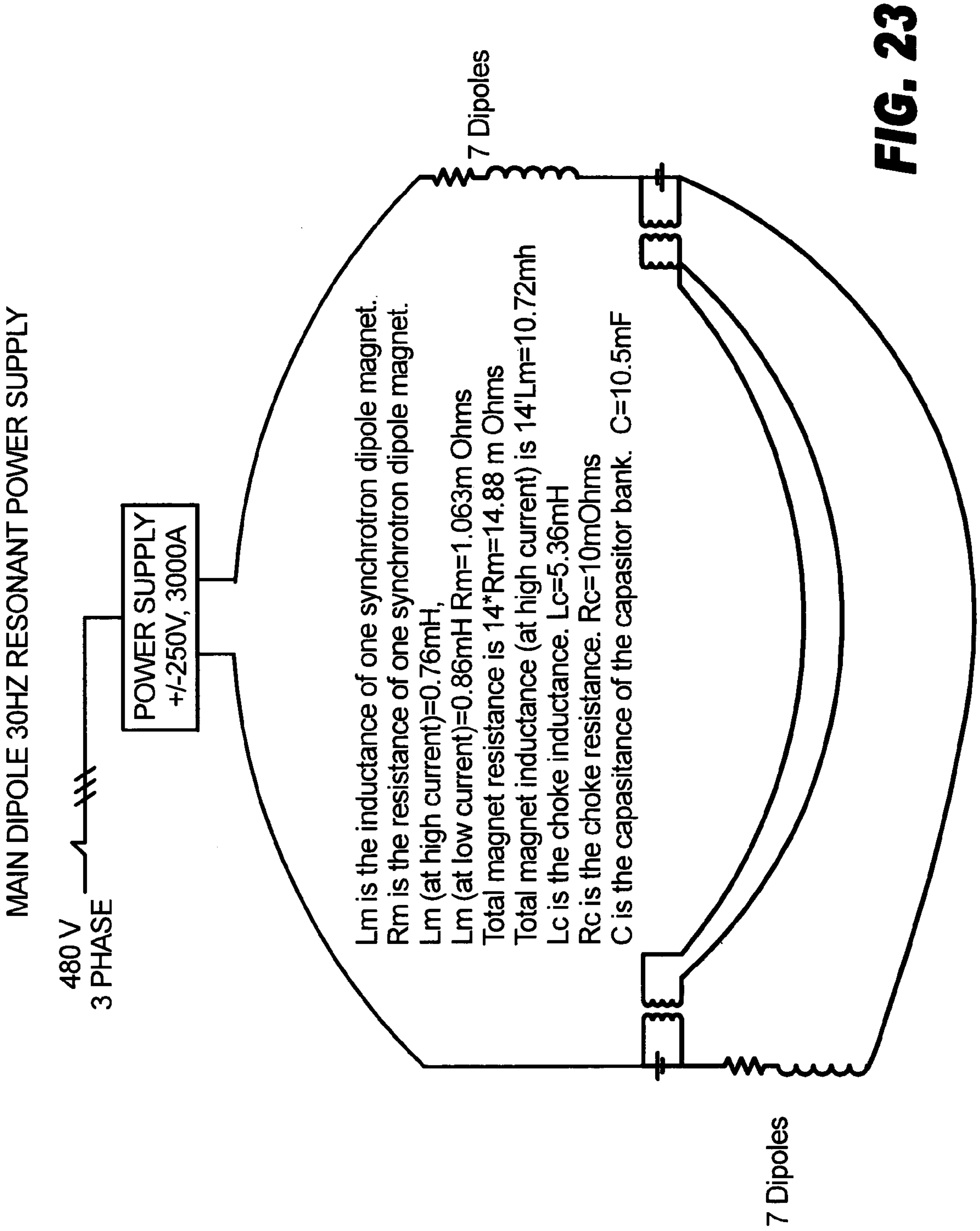
FIG. 23 is an electrical schematic diagram of the resonant synchrotron main magnet power supply of the present invention.

FIG. 23 shows a schematic of the power supply system for the synchrotron main magnets. Two capacitor banks with DC bypass chokes are used in series with the magnets of the synchrotron. The resonant circuit is driven by one programmable excitation power supply. In a series resonant topology, the excitation power supply delivers the full magnet current, but at a significantly reduced voltage when compared to a non-resonant system. The chokes are designed with secondary windings, which are connected to provide coupling between the individual resonant circuits. Table 13 shows the main parameters of the preferred embodiment of the synchrotron main magnet power supply system.

TABLE 13

| | |
|---|---|
| Repetition Rate, $f_{rep}$ [Hz] | 30 |
| Topology | Series Resonant |
| Number of excitation power supplies | 1 |
| Excitation power supply voltage [V] | +/−250 |
| Maximum power supply current [A] | 3000 |
| Nominal peak current | 2700 |
| Injection current [A] | 390 |
| Direct current, $I_{DC}$ [A] | 1480 |
| Alternating current, $I_{AC}$ [A] | 1090 |
| Number of capacitance banks | 2 |
| Number of bypass chokes | 2 |
| Number of main magnets | 14 |
| Capacitance per bank [mF] | 10.58 |
| Inductance of choke [mH] | 5.32 |
| Inductance of main magnet [mH] | 0.76 |
| Resistance of choke [mΩ] | 10 |
| DC resistance per main magnet [mΩ] | 1 |
| Quality factor | 28 |
| Magnet stored energy [kJ] | 39.0 |
| Capacitor stored energy [kJ] | 12.8 |
| Choke stored energy [kJ] | 26.2 |
| Maximum reactive power [MW] | 4.5 |
| Capacitor losses [kW] | 7.4 |
| Choke losses [kW] | 98 |
| Magnet losses (total) [kW] | 53 |
| TOTAL losses [kW] | 163 |

Figure 24:
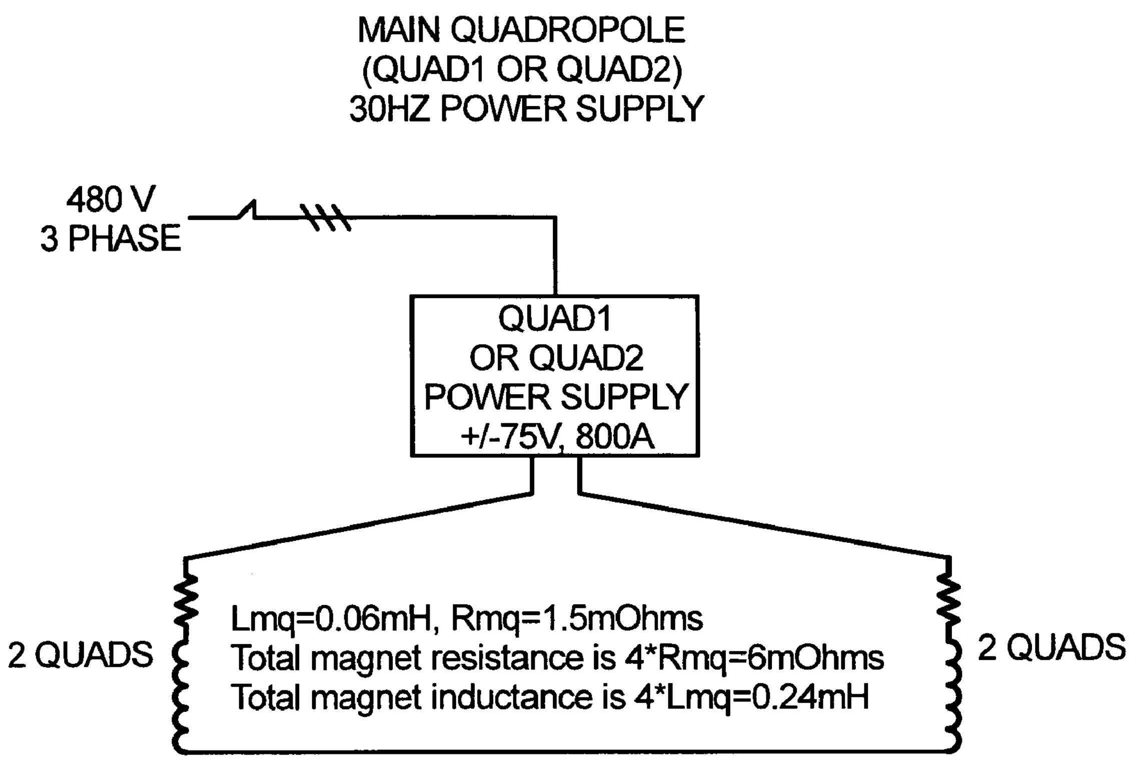
FIG. 24 is an electrical schematic diagram of the synchrotron quadrupole power supply of the present invention.

The three synchrotron quadrupole power supplies are much less demanding in power and performance than the main magnet power supply. Two of the power supplies, "QS1-PS" and "QS2-PS", each drive 4 quads in series, as shown in FIG. 24. The third, "QS3-PS", drives two quadrupoles in series. All three are independently programmable, in order to be able tune the acceleration cycle, for example, to compensate for field saturation effects in the main magnets 36.

The quadrupole power supplies are standard switch mode type units, readily available commercially, with proven high reliability. Switch mode supplies have the advantage of operating at a high frequency, typically 40 kHz, allowing very good regulation and economical filtering. Each supply has a thyristor controlled pre-regulator, which reduces the amount of reactive power the supply draws from the line. Table 14 shows the main parameters of the synchrotron quad power supplies.

TABLE 14

| | QS1, 2-PS | QS3-PS |
|---|---|---|
| Repetition Rate, $f_{rep}$ [Hz] | 30 | 30 |
| Topology | Switch Mode | Switch Mode |
| Number of power supplies | 2 | 1 |
| Power supply voltage [V] | +/−75 | +/−75 |
| Maximum power supply current [A] | 800 | 800 |
| Nominal peak Current [A] | 700 | 700 |
| Number of magnets | 4 | 2 |
| Inductance per magnet [μH] | 60 | 60 |
| DC resistance per magnet [m] | 1.5 | 1.5 |
| Total magnet power loss [kW] | 1.3 | 0.62 |

There are preferably 8 dipole correctors in the synchrotron, and 46 others in the beam transport and delivery beam lines (2 in the R1 line; 6 in the FG line; 4 in the F1; 4 in the F2 line; 6 in the G1 line; 6 in the G2 line; 6 in the G3 line; 8 in the G 4 line; 2 in the T3 line; and 2 in the T4 line). Their power supplies are linear output stage power supplies with a switch mode pre-regulator to maintain 6 volts between collector and emitter under all load and current requirements. These power supplies are bipolar current programmable current regulated at +/−20 Amps and +/−35 Volts. All corrector power supplies are preferably installed in standard 19 inch racks with 6 supplies per rack.

The beam lines will generally operate one at a time. Thus, costs can be reduced by arranging for all of the main beam transport and gantry power supplies to switch from one extraction load to another, through DC switches. These switches are rated to operate about 100,000 times under zero current conditions, once every 10 minutes. They are preferably controlled by Programmable Logic Controllers (PLCs), that set a switch pattern corresponding to the selected beam line.

All of the DC main power supplies have a 12 pulse rectifier topology that uses phase control thyristors. There is one transport supply; one gantry dipole supply; six gantry quadrupole supplies; one DT dipole supply; and one DX (6.5° bend) dipole supply.

The RCMS of the present invention further preferably includes an instrumentation system that will provide measurements of beam intensity, losses, position, transverse and longitudinal beam size, as well as inputs to a safety and monitoring system (SMS). Preferable features of the instrumentation system include relatively low intensity and low energy beams, fast repetition rate, and rapidly sweeping RF.

To measure the beam intensity through the acceleration cycle, a beam current monitor 132 is provided in the synchrotron 14, as shown in FIG. 2. The beam current monitor 132 is preferably a custom DC responding current transformer system. The beam current monitor 132 is preferably located in the synchrotron straight section 30 adjacent the extraction kicker 44*b*. The beam current monitor is preferably mounted around a ceramic break, and enclosed in a shield. A beam transformer front-end amplifier, along with a normalizer, baseline restore, calibration pulse generator, and computer interface electronics are also preferably provided.

To observe the evolution of the bunch phase and longitudinal profile during the acceleration cycle, a wide-band resistive wall current monitor (WCM) 134 is also preferably provided in the straight section 30 of the synchrotron 14. The low frequency limit of the WCM 134 is preferably on the order of a few kHz and is determined by the permeability and size of the core and the gap impedance. The WCM 134 is preferably installed with material to absorb energy propagating down the beam pipe above the cutoff frequency. The signal from the WCM 134 is preferably amplified, buffered, and sent to a high-speed digitizer which will provide data for analysis. The WCM signal also will be available to the low level RF system for beam phase control.

Beam loss monitors 136 are also preferably provided in the synchrotron 14. The beam loss monitors 136 show where beam is being lost and how much is being lost at a given location. This information is used to tune machine parameters so that the loss is eliminated or minimized, thereby keeping activation of machine components to a minimum. A coordinated beam loss system can also provide a beam inhibit input to the SMS which has the capability of interlocking the synchrotron 14 if losses exceed prescribed levels. Typical uncontrolled loss criteria of 1 W/m will keep the residual levels below 100 mRem/hour to allow hands-on maintenance work after a short cool down period.

The beam loss monitors 136 preferably utilize proportional chambers and/or scintillator/PMT detectors. These detectors are more sensitive to neutrons and low energy beam losses at injection than traditional ion chamber detectors. Beam loss monitors 136 are preferably located at 8 significant loss points around the ring. Significant loss points include the quadrupoles, injection and extraction devices, the RF cavity and collimators. The beam loss monitors 136 in the ring 14 preferably have the capability of manual relocation to help diagnose particular beam loss problems. Loss signals can be transmitted through coaxial cables to be processed by front-end electronics, and digitized for display and analysis.

The beam profile monitors 80 discussed above are preferably of the luminescent target type, such as model No. DF120 supplied by Princeton Scientific. This type of beam profile monitor has a target holder, solenoid actuator, and viewing port all mounted on a 600 O.D. conflat flange. This semi-destructive diagnostic can be inserted during commissioning, tuning, maintenance, or troubleshooting of the RCMS. A CCD camera with lens can also be mounted near the device and the video signal transported to a PC based video digitizer for image processing. There are preferably one such device in the synchrotron straight section downstream of the injection kicker, several in the extraction transport lines, and two in each gantry.

As also discussed above, the synchrotron 14 is further instrumented with dual plane capacitive pick-up style beam position monitors (BPM) 40 at the beginning, middle and end of each 180-degree arc. BPMs 40 are also preferably installed in several places along each of the extraction transfer lines. Each BPM 40 is preferably mechanically indexed to nearby quadrupoles. A high impedance amplifier is preferably mounted near each pick-up.

The vacuum systems of RCMS can be divided conveniently into the synchrotron vacuum system and the transport line vacuum systems. The operating pressure of the synchrotron is preferably $<10^{-7}$ Torr. This is preferred not only to minimize beam scattering by residual gases, but also for the reliable operation of injection and extraction devices and the accelerating cavity. The vacuum requirement in the transport lines is less stringent. Here the vacuum level is preferably $10^{-6}$ Torr for the operation of the beam diagnostic equipment and for the lifetime of the vacuum pumps.

Figure 25:
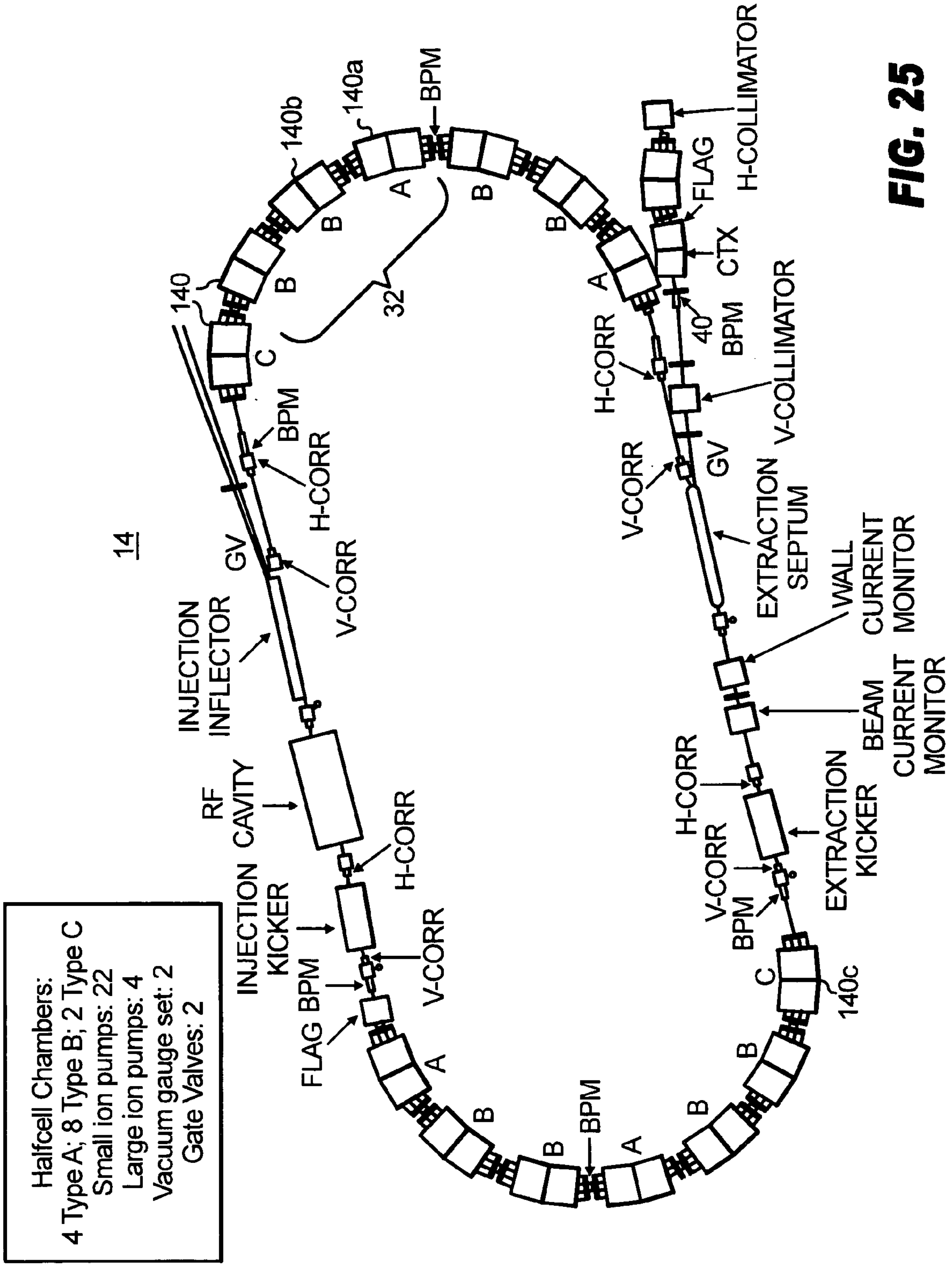
FIG. 25 is a top plan view of the synchrotron vacuum system of the present invention.

The layout of the synchrotron vacuum system is shown in FIG. 25. The two 180 degree arc sections 32 of the synchrotron 14 preferably have 14 vacuum chambers 140. They are grouped into three types. Type A 140*a* will have a main magnet chamber, a BPM housing and a bellows welded together into one chamber. Type B 140*b* will be the same as type A 140*a* except that it will have a pump port instead of a BPM. Type C 140*c* will have a quadrupole pipe, one pump port, one BPM and two bellows. Most of the chambers are preferably made of Inconel 625 for its mechanical strength, its non-magnetic properties as well as its high resistivity, which reduces eddy current and heating. The main magnet chambers preferably have an elliptical cross section of 3 cm×5 cm with a 0.64 mm wall and a bending angle of 25.7 degrees. The quadrupole pipes preferably have a diameter of 3 cm with a 0.64 mm wall. There are also preferably 8 quadrupole pipes in the two straight sections interfacing with beam components.

The transport line vacuum system includes the extraction line from the synchrotron and the transfer lines which go to the research room, the fixed targets, and the multiple gantries. A vacuum of $10^{-6}$ Torr is sufficient in the beam transport lines and is mainly for the operation of the beam diagnostic equipment and for the lifetime of the vacuum pumps. The beam pipes for the transport lines are preferably made of either stainless steel or aluminum tubes of 2 cm in diameter.

Diode type sputter ion pumps are preferably used throughout the RCMS as high vacuum pumps for reliability, lifetime and cost. These pumps can be powered by conventional DC +5 kV power supplies. The sputter ion pump current, proportional to the pressure level, provides a detailed pressure profile throughout RCMS. In addition, a few sets of Pirani and cold cathode vacuum gauges are preferably positioned at strategic locations to monitor the absolute pressure inside the beam pipes. A residual gas analyzer can also be installed in the ring and one in the transport line to provide a quick analysis of the partial pressure composition. Portable turbo-molecular pump/dry mechanical pump stations can be used to pump down each vacuum section during start up, maintenance and repair.

As a result of the present invention, a rapid cycling medical synchrotron (RCMS) is provided. The RCMS is a state-of-the-art second generation proton synchrotron design, capable of treating 200-250 patients per day. The present invention utilizes strong focusing, rapid cycling and fast extraction techniques to reduce magnet apertures and thereby reduce weight and cost.

Although preferred embodiments of the present invention have been described herein with reference to the accompanying drawings, it is to be understood that the invention is not limited to those precise embodiments and that various other changes and modifications may be affected herein by one skilled in the art without departing from the scope or spirit of the invention, and that it is intended to claim all such changes and modifications that fall within the scope of the invention.

The invention claimed is:

1. A medical synchrotron for accelerating particles in a particle beam therapy system, the synchrotron comprising: a radiofrequency (RF) cavity for accelerating the particles as a beam; and a plurality of combined function magnets arranged in a ring, each of said combined function magnets performing a first function of bending the particle beam along an orbital path around said ring and a second function of focusing or defocusing the particle beam, wherein said combined function magnets comprise: an arcuate beam pipe defined by a center of curvature; two saddle coils arranged on opposite sides of said beam pipe; and a ferro-magnetic core surrounding said beam pipe and said saddle coils, said core having a structural configuration for providing a magnetic field in said beam pipe which varies in strength in a direction toward said beam pipe center of curvature.

2. A medical synchrotron as defined in claim 1, wherein said plurality of combined function magnets comprises a focusing magnet arranged in sequence with a defocusing magnet, said focusing magnet performing the combined function of bending the particle beam and focusing the particle beam and said defocusing magnet performing the combined function of bending the particle beam and defocusing the particle beam.

3. A medical synchrotron as defined in claim 1, wherein said core has a structural configuration adapted for providing a magnetic field in said beam pipe which becomes weaker in the direction toward said beam pipe center of curvature to form a horizontally focusing combined function magnet.

4. A medical synchrotron as defined in claim 1, wherein said core has a structural configuration adapted for providing a magnetic field in said beam pipe which becomes stronger in the direction toward said beam pipe center of curvature to form a horizontally defocusing combined function magnet.

5. A medical synchrotron as defined in claim 1, wherein said ferro-magnetic core comprises a plurality of upper laminates and a plurality of lower laminates stacked on opposite sides of said beam pipe, said upper and lower laminates having a middle arm terminating at an angled end adjacent said beam pipe, the orientation of said angled ends of said upper and lower laminates providing said varying strength magnetic field in said beam pipe.

6. A medical synchrotron as defined in claim 5, wherein said angled ends of said upper and lower laminates form an angle whose intersection point falls outside an outer arc of said beam pipe with respect to said beam pipe center of curvature to form a focusing combined function magnet.

7. A medical synchrotron as defined in claim 5, wherein said angled ends of said upper and lower laminates form an angle whose intersection point falls inside an inner arc of said beam pipe with respect to said beam pipe center of curvature to form a defocusing combined function magnet.

8. A medical synchrotron as defined in claim 1, wherein said radiofrequency (RF) cavity is a ferrite loaded cavity adapted for high speed frequency swings for rapid cycling acceleration of the particles.

9. A medical synchrotron as defined in claim 8, wherein said ferrite loaded RF cavity is adapted for a frequency swing of from about 1.2 MHz to about 6.0 MHz in about 15-17 ms.

10. A medical synchrotron for accelerating particles in a particle beam therapy system, the synchrotron comprising:

a radiofrequency (RF) cavity for accelerating the particles as a beam; and a plurality of combined function magnets arranged in a ring, each of said combined function magnets performing a first function of bending the particle beam alone an orbital path around said ring and a second function of focusing or defocusing the particle beam, wherein said radiofrequency (RF) cavity is a ferrite loaded cavity adapted for high speed frequency swings for rapid cycling acceleration of the particles, and wherein said ferrite loaded RF cavity comprises:

a housing;

a beam pipe centrally disposed in said housing, said beam pipe having two longitudinal gaps; and a plurality of ferrite rings associated with each gap surrounding said beam pipe.

11. A method for accelerating particles in a medical synchrotron of a particle beam therapy system, the method comprising the steps of:

steering particles of a particle beam along an orbital path with a plurality of magnets arranged in a ring defining said orbital path; and applying a tuning current to a ferrite loaded radiofrequency (RF) cavity disposed in said orbital path to achieve a high speed frequency swing for rapid cycling acceleration of the particles in said particle beam, wherein said ferrite loaded RF cavity comprises:

a housing;

a beam pipe centrally disposed in said housing, said beam pipe having two longitudinal gaps; and a plurality of ferrite rings associated with each gap surrounding said beam pipe.

12. A method as defined in claim 11, wherein said tuning current is applied to said ferrite loaded RF cavity to achieve a frequency swing of from about 1.2 MHz to about 6.0 MHz in about 15-17 ms.

13. A method as defined in claim 12, wherein said tuning current is applied at a repetition rate of about 30 Hz.

14. A method as defined in claim 11, further comprising the steps of focusing and defocusing said particle beam along said orbital path with said plurality of magnets to provide net strong focusing in both horizontal and vertical planes.

15. A method as defined in claim 14, wherein said steps of steering said particle beam, focusing said particle beam and defocusing said particle beam are performed with a focusing combined function magnet and a defocusing combined function magnet arranged in sequence in said ring, said focusing combined function magnet providing a first function of bending the particle beam and a second function of focusing the particle beam, and said defocusing combined function magnet providing a first function of bending the particle beam and a second function of defocusing the particle beam.

16. A particle beam therapy system comprising:

a source of particles;

a synchrotron for accelerating the particles as a particle beam, said synchrotron including a plurality of combined function magnets arranged in a ring and a ferrite loaded radiofrequency (RF) cavity disposed in said ring, each of said combined function magnets performing a first function of bending the particle beam along an orbital path around said ring and a second function of focusing or defocusing the particle beam and said radiofrequency cavity being adapted for high speed frequency swings for rapid cycling acceleration of the particles;

an injector for transporting particles from said source to said synchrotron;

a patient treatment station including a rotatable gantry for delivering a particle beam to a patient; and a beam transport system for transporting the accelerated beam from said synchrotron to said patient treatment station, wherein said ferrite loaded RF cavity comprises:

a housing;

a beam pipe centrally disposed in said housing, said beam pipe having two longitudinal gaps; and a plurality of ferrite rings associated with each gap surrounding said beam pipe.

17. A particle beam therapy system as defined in claim 16, wherein said ferrite loaded RF cavity is adapted for a frequency swing of from about 1.2 MHz to about 6.0 MHz in about 15-17 ms.

18. A particle beam therapy system as defined in claim 16, wherein said plurality of combined function magnets comprises a focusing magnet arranged in sequence with a defocusing magnet, said focusing magnet performing the combined function of bending the particle beam and focusing the particle beam and said defocusing magnet performing the combined function of bending the particle beam and defocusing the particle beam.

19. A particle beam therapy system comprising: a source of particles; a synchrotron for accelerating the particles as a particle beam, aid synchrotron including a plurality of combined function magnets arranged in a ring and a ferrite loaded radiofrequency (RF) cavity disposed in said ring, each of said combined function magnets performing a first function of bending the particle beam along an orbital path around said ring and a second function of focusing or defocusing the particle beam and said radiofrequency cavity being adapted for high speed frequency swings for rapid cycling acceleration of the particles; an injector for transporting particles from said source to said synchrotron; a patient treatment station including a rotatable gantry for delivering a particle beam to a patient; and a beam transport system for transporting the accelerated beam from said synchrotron to said patient treatment station wherein said combined function magnets comprise: an arcuate beam pipe defined by a center of curvature; two saddle coils arranged on opposite sides of said beam pipe; and a ferro-magnetic core surrounding said beam pipe and said saddle coils, said core having a structural configuration for providing a magnetic field in said beam pipe which varies in strength in a direction toward said beam pipe center of curvature.

20. A particle beam therapy system as defined in claim 19, wherein said core has a structural configuration adapted for providing a magnetic field in said beam pipe which becomes weaker in the direction toward said beam pipe center of curvature to form a focusing magnet.

21. A particle beam therapy system as defined in claim 19, wherein said core has a structural configuration adapted for providing a magnetic field in said beam pipe which becomes stronger in the direction toward said beam pipe center of curvature to form a defocusing magnet.

22. A particle beam therapy system as defined in claim 19, wherein said ferro-magnetic core comprises a plurality of upper laminates and a plurality of lower laminates stacked on opposite sides of said beam pipe, said upper and lower laminates having a middle arm terminating at an angled end adjacent said beam pipe, the orientation of said angled ends of said upper and lower laminates providing said varying strength magnetic field in said beam pipe.

23. A particle beam therapy system as defined in claim 22, wherein said angled ends of said upper and lower laminates form an angle whose intersection point falls outside an outer arc of said beam pipe with respect to said beam pipe center of curvature to form a focusing magnet.

24. A particle beam therapy system as defined in claim 22, wherein said angled ends of said upper and lower laminates form an angle whose intersection point falls inside an inner arc of said beam pipe with respect to said beam pipe center of curvature to form a defocusing magnet.

* * * * *